United States Patent
Eichenfield et al.

(10) Patent No.: US 11,569,431 B1
(45) Date of Patent: Jan. 31, 2023

(54) PIEZOELECTRIC DEFORMABLE PHOTONIC DEVICES

(71) Applicant: National Technology & Engineering Solutions of Sandia, LLC, Albuquerque, NM (US)

(72) Inventors: Matt Eichenfield, Albuquerque, NM (US); Andrew Jay Leenheer, Albuquerque, NM (US); Paul Stanfield, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 437 days.

(21) Appl. No.: 16/989,535

(22) Filed: Aug. 10, 2020

Related U.S. Application Data

(60) Provisional application No. 62/888,841, filed on Aug. 19, 2019.

(51) Int. Cl.

| | | |
|---|---|---|
| *H01L 41/08* | (2006.01) | |
| *H01L 41/083* | (2006.01) | |
| *G02F 1/125* | (2006.01) | |
| *G02F 1/01* | (2006.01) | |
| *H01L 41/18* | (2006.01) | |
| *G02B 6/35* | (2006.01) | |

(52) U.S. Cl.
CPC ........ *H01L 41/0815* (2013.01); *G02B 6/3578* (2013.01); *G02F 1/0134* (2013.01); *G02F 1/125* (2013.01); *H01L 41/083* (2013.01); *H01L 41/18* (2013.01)

(58) Field of Classification Search
CPC .................................................... G02F 1/0134
See application file for complete search history.

(56) References Cited

U.S. PATENT DOCUMENTS

| | | | | |
|---|---|---|---|---|
| 5,313,535 A | * | 5/1994 | Williams | G02F 1/0134 |
| | | | | 385/14 |
| 11,456,721 B2 | * | 9/2022 | Eid | H03H 9/1014 |

OTHER PUBLICATIONS

Akiyama, M. et al., "Influence of growth temperature and scandium concentration on piezoelectric response of scandium aluminum nitride alloy thin films," Applied Physics Letters (2009) 95:162107, 3 pages.

(Continued)

*Primary Examiner* — Omar R Rojas
(74) *Attorney, Agent, or Firm* — Mark A. Dodd

(57) ABSTRACT

A CMOS-compatible actuator platform for implementing phase, amplitude, and frequency modulation in silicon nitride photonic integrated circuits via piezo-optomechanical coupling using tightly mechanically coupled aluminum nitride actuators is disclosed. The platform, which may be fabricated in a CMOS foundry, enables scalable active photonic integrated circuits for visible wavelengths, and the piezoelectric actuation functions without performance degradation down to cryogenic operating temperatures. A number of devices are possible, including ring modulator devices, phase shifter devices, Mach-Zehnder interferometer devices, directional coupler devices (including tunable directional coupler devices), and acousto-optic modulator and frequency shifter devices, each of which can employ the same AlN actuator platform. As all of these devices can be built on the same AlN actuator platform, numerous optical functions can be implemented on a single die.

20 Claims, 10 Drawing Sheets

(56) References Cited

OTHER PUBLICATIONS

Bulgan, E. et al., "Submicron silicon waveguide optical switch driven by microelectromechanical actuator," Applied Physics Letters (2008) 92:101110, 3 pages.

Donati, S. et al., "Piezoelectric Actuation of Silica-On-Silicon Waveguide Devices," IEEE Photonics Technology Letters (1998) 10(10):1428-1430.

Dong, B. et al., "Port: A Piezoelectric Optical Resonance Tuner," MEMS (2018) Belfast, North Ireland, UK, Jan. 21-25, pp. 739-742.

Douglas, E. A. et al., "Effect of precursors on propagation loss for plasma-enhance chemical vapor deposition of SiNx:H Waveguides," Optical Materials Express (2016) 6(9):2892-2903.

Du, H. et al., "Mechanically-Tunable Photonic Devices with On-Chip Integrated MEMS/NEMS Actuators," Micromachines (2016) 7:69, 24 pages.

Elshaari, A. W. et al., "Thermo-Optic Characterization of Silicon Nitride Resonators for Cryogenic Photonic Circuits," IEEE Photonics Journal (2016) 8(3):2701009, 9 pages.

Enami, Y. et al., "Hybrid polymer/sol-gel waveguide modulators with exceptionally large electro-optic coefficients," Mature Photonics (2007) 1:180-185.

Epping, J. P. et al., "Ultra-low-power stress-optics modulator for microwave photonics," Integrated Optics: Devices, Materials, and Technologies XXI, Garcia-Blanco, S. M. et al. (eds)., (2017) Proc. of SPIE vol. 10106, 8 pages.

Gehl, M. et al., "Operation of high-speed silicon photonic microdisk modulators at cryogenic temperatures," Optica (2017) 4(3):374-382.

Han, S. et al., "Large-scale silicon photonic switches with movable directional couplers," Optica (2015) 2(4):370-375.

Hosseini, N. et al., "Stress-optic modulator in TriPleX platform using a piezoelectric lead zirconate titanate (PZT) thin film," Optics Express (2015) 23(11):14018-14026.

Jin, W. et al., "Piezoelectrically tuned silicon nitride ring resonator," Optics Express (2018) 26(3):3174-3187.

Jin, W. et al., "Piezoelectric tuning of a suspended silicon nitride ring resonator," IEEE Photonics Conference (2017) Orlando, FL, Oct. 1-5, pp. 117-118.

Johnson, S. G. et al., "Perturbation theory for Maxwell's equations with shifting material boundaries," Physical Review E (2002) 65:066611, 7 pages.

Sebbag, Y. et al., "Bistability in silicon microring resonator based on strain induced by a piezoelectric lead cirzonate titanate thin film," Applied Physics Letters (2012) 100:141107, 4 pages.

Seok, T. J. et al., "large-scale broadband digital silicon photonic switches with vertical adiabatic couplers," Optica (2016) 3(1):64-70.

Wang, C. et al., "Integrated lithium niobate electro-optic modulators operating at CMOS-compatible voltages," Nature (2018) 562:101-104.

Xiong, C. et al., "Low-Loss, Silicon Integrated, Aluminum Nitride Photonic Circuits and Their Use for Electro-Optic Signal Processing," Nano Letters (2012) 12:3562-3568.

Zhu, S. et al., "Aluminum nitride electro-optic phase shifter for backend integration on silicon," Optics Express (2016) 24(12):12501-12506.

\* cited by examiner

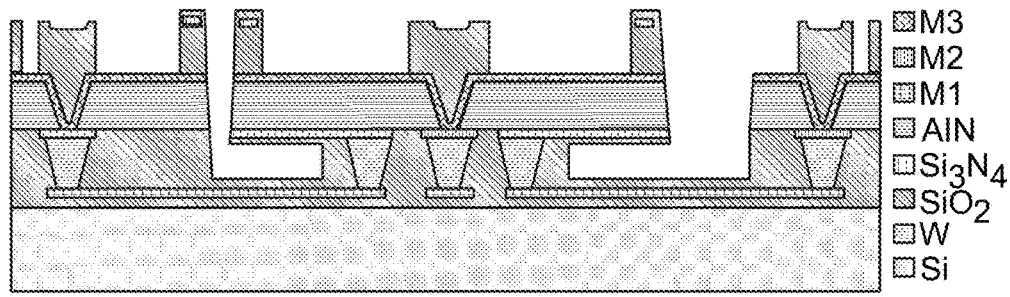
FIG. 1A
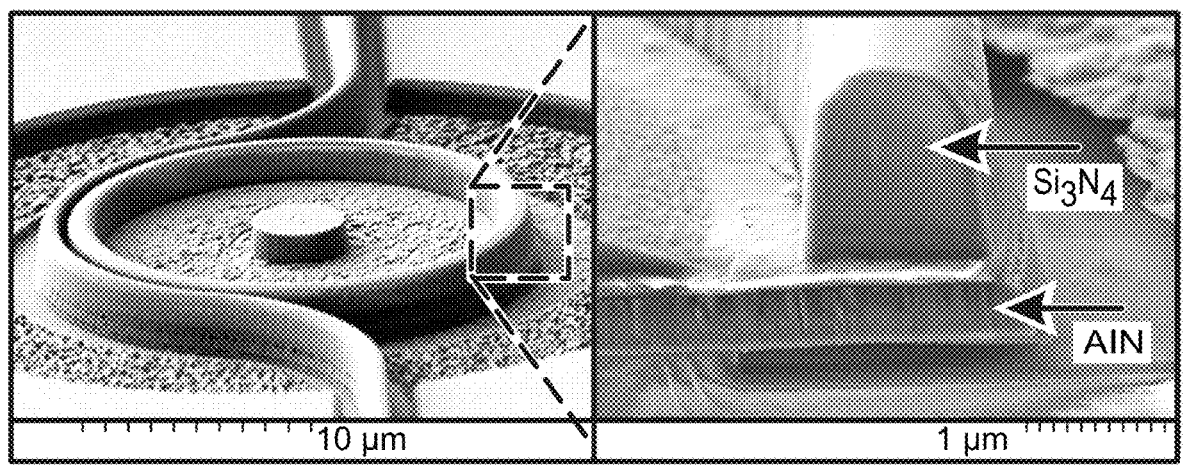
FIG. 1B  FIG. 1C
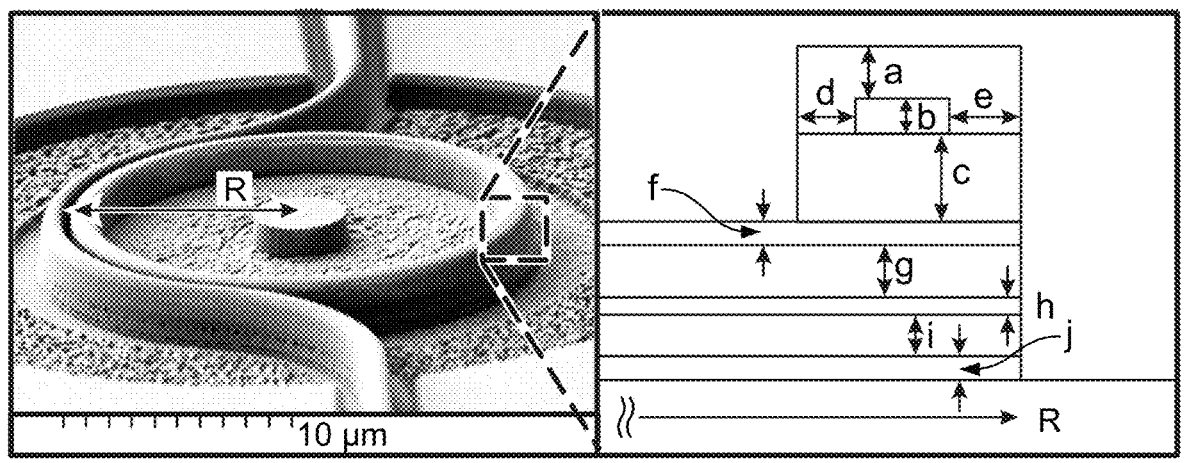
FIG. 2A  FIG. 2B

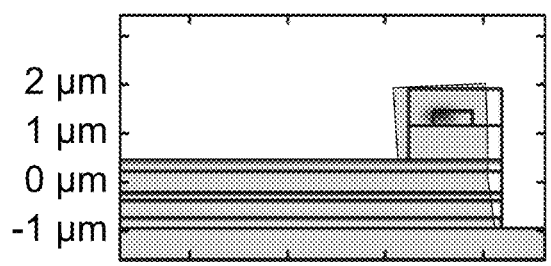
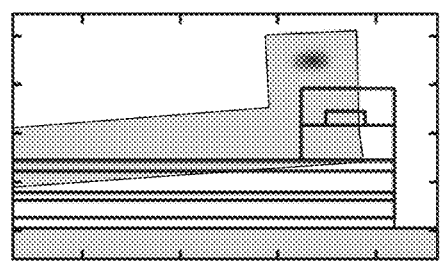
FIG. 3A　　　　　　　FIG. 3B
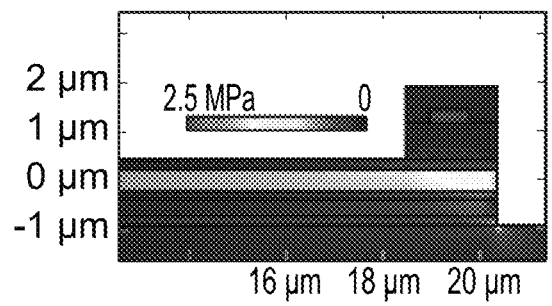
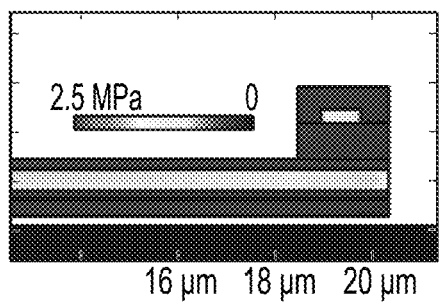
FIG. 3C　　　　　　　FIG. 3D
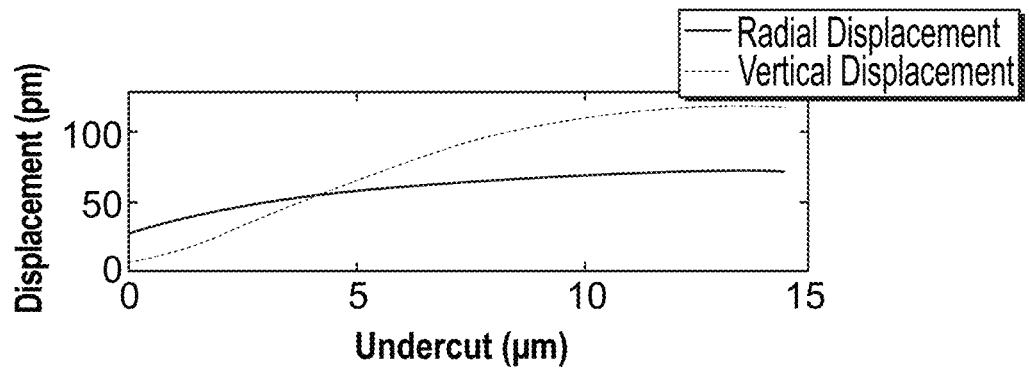
FIG. 4A
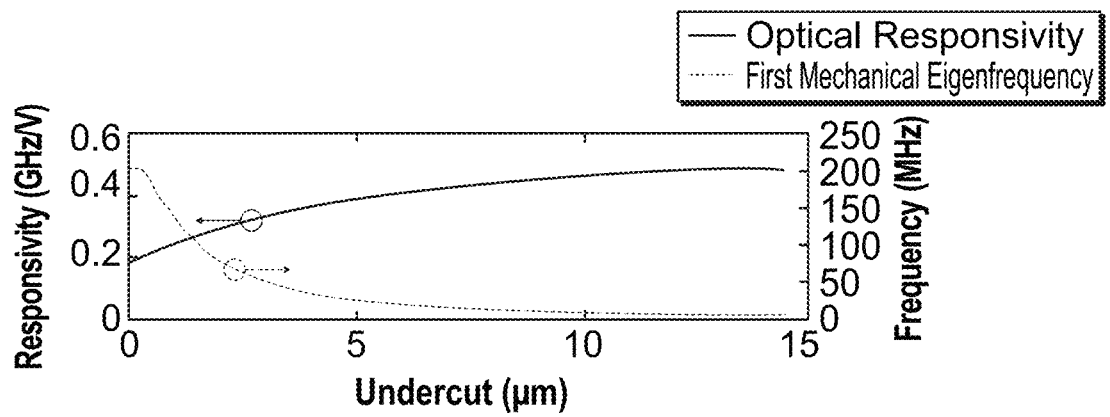
FIG. 4B

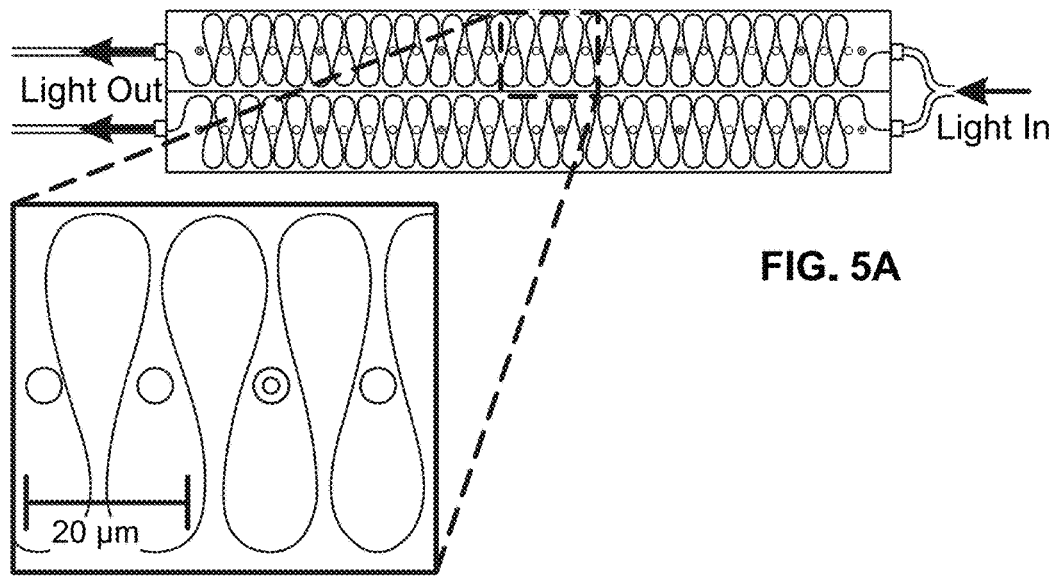
FIG. 5A
FIG. 5B
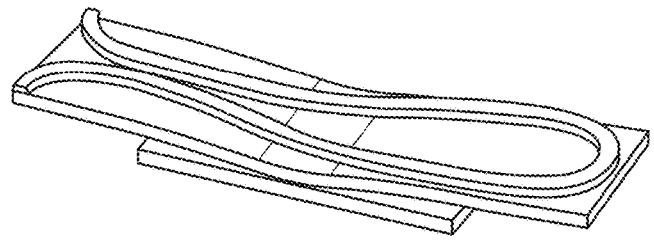
FIG. 5C
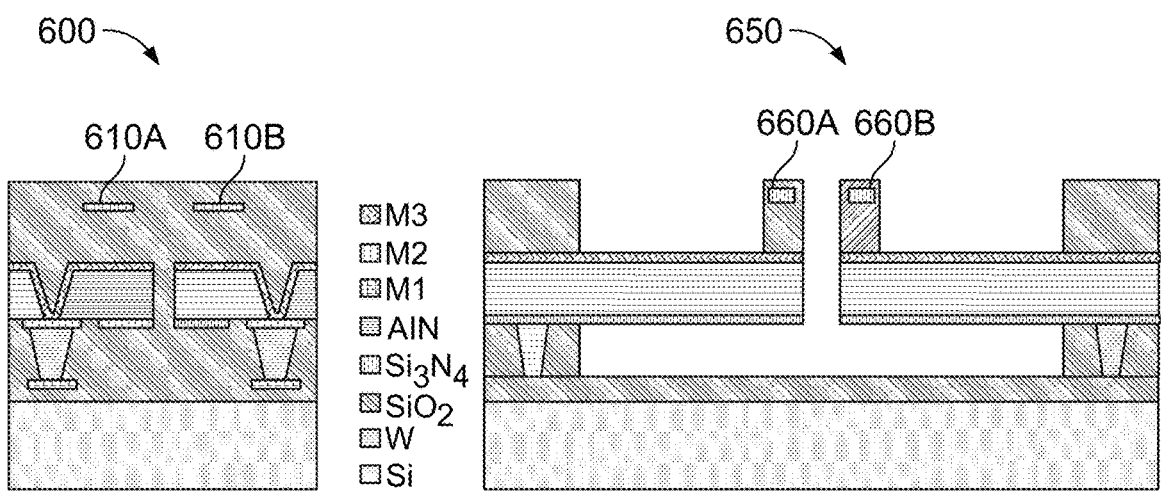
FIG. 6A
FIG. 6B

_US 11,569,431 B1_

PIEZOELECTRIC DEFORMABLE PHOTONIC DEVICES

RELATED APPLICATIONS

This application claims priority to U.S. Provisional Application No. 62/888,841, filed on Aug. 19, 2019, and entitled PIEZOELECTRIC DEFORMABLE PHOTONIC DEVICES, the entirety of which is incorporated herein by reference.

STATEMENT OF GOVERNMENT INTEREST

This invention was made with Government support under Contract No. DE-NA0003 525 awarded by the United States Department of Energy/National Nuclear Security Administration. The Government has certain rights in the invention.

TECHNICAL FIELD

The present invention relates to CMOS-compatible, piezoelectric deformable photonic devices formed of a piezo-optomechanically tunable photonic platform operable at visible wavelengths and over a wide temperature range, including at cryogenic temperatures.

BACKGROUND

Many applications operating with wavelengths well below the silicon bandgap of 1100 nm require a scalable, low-power, active photonic integrated circuit architecture that would allow for dynamic optical routing and optical phase and amplitude modulation. The need for scalability would be best satisfied using a completely CMOS-compatible set of materials and fabrication methods. In addition, this would simplify integration with driver electronics, which are required for the electrical I/O density of many applications when implemented at scale. Such a platform had not been effectively demonstrated, until the advent of the present invention.

A modest number of examples of CMOS-compatible modulators that could satisfy these requirements exist in the literature. The most compelling devices presented have used direct electro-optic modulation of aluminum nitride (AlN) waveguiding layers. See C. Xiong, et al., "Low-Loss, Silicon Integrated, Aluminum Nitride Photonic Circuits and Their Use for Electro-Optic Signal Processing," Nano Letters, vol. 12, pp. 3562-3568 (2012); and S. Y. Zhu and G. Q. Lo, "Aluminum nitride electro-optic phase shifter for back-end integration on silicon," Optics Express, vol. 24, pp. 12501-12506 (2016), the contents of each of which are incorporated herein by reference. However, these AlN modulators suffer from high optical losses at short wavelengths due to Rayleigh scattering arising from the polycrystallinity of AlN grown by physical vapor deposition. This loss, combined with the large $LV_\pi$ characteristic of AlN, results in fairly poor performance at near-visible wavelengths and shorter. The other currently available solution is thermo-optic tuning of CMOS-compatible dielectrics such as silicon nitride ($Si_3N_4$) and silicon dioxide ($SiO_2$). Thermo-optic modulators suffer from a relatively high power consumption necessary to produce a sufficient refractive index change that limits their potential scalability. This problem is compounded when attempting to operate at cryogenic temperatures where the efficacy of temperature tuning decreases and thermal budgets become even more constrained. See A. W. Elshaari, et al., "Thermo-Optic Characterization of Silicon Nitride Resonators for Cryogenic Photonic Circuits," IEEE Photonics Journal, vol. 8, no. 3, art. no. 2701009 (2016), the contents of which are incorporated herein by reference. Previous attempts to use AlN for strain-based modulation have not utilized it as part of a CMOS-compatible flow and have suffered from poor performance. See B. Dung, et al., "PORT: A Piezoelectric Optical Resonance Tuner," 2018 IEEE Micro Electro Mechanical Systems (MEMS 2018-Belfast), pp. 739-742 (2018), the contents of which are incorporated herein by reference.

Potentially wavelength agnostic platforms such as piezoelectric lead zirconate titanate (PZT) strain modulation have been presented previously but are not strictly CMOS-compatible. See S. Donati, et al., "Piezoelectric actuation of silica-on-silicon waveguide devices," IEEE Photonics Technology Letters, vol. 10, pp. 1428-1430 (1998); J. P. Epping, et al., "Ultra-low-power stress-optics modulator for microwave photonics," Integrated Optics: Devices, Materials, and Technologies XXI, art. no. 10106 (2017); N. Hosseini, et al., "Stress-optic modulator in TriPleX platform using a piezoelectric lead zirconate titanate (PZT) thin film," Optics Express, vol. 23, pp. 14018-14026 (2015); W. Jin, et al., "Piezoelectrically tuned silicon nitride ring resonator," Optics Express, vol. 26, pp. 3174-3187 (2018); W. Jin, et al., "Piezoelectric tuning of a suspended silicon nitride ring resonator," 30th Annual Conference of the IEEE Photonics Society (IPC), pp. 117-118 (2017); and Y. Sebbag, et al., "Bistability in silicon microring resonator based on strain induced by a piezoelectric lead zirconate titanate thin film," Applied Physics Letters, vol. 100, art. no. 141107 (2012), the contents of each of which are incorporated herein by reference. Beyond this fabrication constraint, PZT is challenging to use because of significant hysteresis and an extremely large dielectric constant, which limits modulation speed. More exotic modulation platforms such as lithium niobite ($LiNbO_3$), polymer waveguides, and others have demonstrated impressive results, but, lacking CMOS-compatibility, they do not have a clear path towards high-yield, very-large-scale integration, which is critical for many applications. See Y. Enami, et al., "Hybrid polymer/sol-gel waveguide modulations with exceptionally large electro-optic coefficients," Nature Photonics, vol. 1, pp. 180-185, 423 (2007); and C. Wang, et al., "Integrated lithium niobate electro-optic modulators operating at CMOS-compatible voltages," Nature, vol. 562, pp. 101-104 (2018), the contents of each of which are incorporated herein by reference.

Thus, the need remains for a scalable, low-power, active photonic integrated circuit platform that would allow for dynamic optical routing and optical phase, amplitude, and frequency modulation for those applications with operational wavelengths well below the silicon bandgap of ~1100 nm, including applications that require operation at cryogenic temperatures.

SUMMARY

One aspect of the present invention relates to a platform for phase, amplitude, and frequency modulation in $Si_3N_4$ photonic integrated circuits via piezo-optomechanical coupling using tightly mechanically coupled AlN actuators. The platform, fabricated in a CMOS foundry, enables scalable active photonic integrated circuits for visible wavelengths (300 nm to 6 μm when using $Si_3N_4$), and the piezoelectric actuation functions without performance degradation down to cryogenic temperatures. One embodiment of the present invention relates to a compact (~40 μm diameter) $Si_3N_4$ ring resonator modulator operating at 780 nm with an intrinsic quality factor in excess of 1.5 million, >10 dB change in extinction ratio with 2 V applied, a switching time of less than 4 ns, and a switching energy of 0.5 pJ/bit. When operating this exemplary device at 7 K, the device has a resistance of approximately $2\times10^{13}\Omega$, allowing it to operate with sub-picowatt electrical power dissipation. Another embodiment of the present invention relates to a Mach-Zehnder modulator constructed in the same platform with piezoelectrically tunable phase shifting arms, with 750 ns switching time constant and 20 nW steady-state power dissipation at room temperature. These results for the ring resonator modulator and Mach-Zehnder modulator are preliminary and do not represent the full potential of the various embodiments of the present invention. Yet other embodiments of the present invention include directional couplers (including tunable directional couplers), phase shifters, and acousto-optic modulators and frequency shifters.

In at least one embodiment of the present invention, a CMOS-compatible piezoelectric deformable photonic device platform comprises a first contact layer (the first contact layer for routing an actuation bias), a dielectric layer formed on the first contact layer, a second contact layer formed on the dielectric layer (the second contact layer for receiving a first polarity of the actuation bias), a piezoelectric material layer formed on the second contact layer, a third contact layer formed on the piezoelectric material layer (the third contact layer for receiving a second polarity of the actuation bias), a first cladding layer formed on the third contact, a waveguide formed on the first cladding layer (the waveguide for transmitting an optical signal), and a second cladding layer formed on the waveguide, the first cladding layer and the second cladding layer are for guiding the optical signal in the waveguide, and the waveguide is piezo-optomechanically coupled to the piezoelectric material when the second contact layer and the third contact layer receive the actuation bias, the piezo-optomechanical coupling inducing a strain induced photoelastic refractive index change in the waveguide or a movement of material boundaries that causes an optomechanical change to an effective refractive index of an optical mode within the waveguide.

In various embodiments of the invention, at least a portion of the waveguide has been undercut due to removal of at least a portion of the dielectric layer; the piezoelectric material layer includes AlN or an alloy of AlN—ScN; the waveguide includes $SiN_x$, $Al_2O_3$, AlN, or doped $SiO_2$; and the first and second cladding layers include $SiO_2$ or $Si_3N_4$.

In other embodiments of the present invention, the CMOS-compatible piezoelectric deformable photonic device platform forms a ring modulator device further comprising a second waveguide formed on the first cladding layer, the second cladding layer formed on the second waveguide (the second waveguide for transmitting a second optical signal, the second waveguide evanescently coupled to the waveguide); and the CMOS-compatible piezoelectric deformable photonic device platform forms a phase shifter device, the waveguide being either a platform-actuated or a collinear-actuated phase shifting waveguide.

In yet other embodiments of the present invention, the CMOS-compatible piezoelectric deformable photonic device platform forms a Mach-Zehnder interferometer device, the waveguide including a first coupler having an input and first and second outputs, first and second platform-actuated or collinear-actuated phase shifting arms coupled to corresponding ones of the first and second outputs of the first coupler, and a second coupler having first and second inputs and an output, the first and second inputs of the second coupler coupled to corresponding ones of the first and second platform-actuated or collinear-actuated phase shifting arms; and the CMOS-compatible piezoelectric deformable photonic device platform forms a directional coupler device further comprising a second waveguide formed on the first cladding layer, the second cladding layer formed on the second waveguide (the second waveguide for transmitting a second optical signal, the second waveguide adjacent the waveguide), and the first and second cladding layers are continuous between the waveguide and the second waveguide or include a gap between the waveguide and the second waveguide.

In still other embodiments of the present invention, the compatible piezoelectric deformable photonic device platform forms an acousto-optic modulator device further comprising first and second interdigital transducers (IDTs) (each of the first and second IDTs including a corresponding plurality of parallel fingers, the plurality of fingers of the first and second IDTs being substantially parallel or substantially perpendicular to the optical signal); and the CMOS-compatible piezoelectric deformable photonic device platform forms at least two devices, each of the at least two devices including at least a ring modulator device, a phase shifter device, a Mach-Zehnder interferometer device, a directional coupler device, a tunable directional coupler device, an acousto-optic modulator device, or a frequency shifter device.

In at least one embodiment of the present invention, a ring modulator device comprises a first contact layer (the first contact layer for routing an actuation bias), a dielectric layer formed on the first contact layer, a second contact layer formed on the dielectric layer (the second contact layer for receiving a first polarity of the actuation bias), a piezoelectric material layer formed on the second contact layer, a third contact layer formed on the piezoelectric material layer (the third contact layer for receiving a second polarity of the actuation bias), a first cladding layer formed on the third contact, first and second waveguides formed on the first cladding layer (the first and second waveguides for transmitting corresponding first and second optical signals, the second waveguide evanescently coupled to the first waveguide), and a second cladding layer formed on the first and second waveguides, the first and second cladding layers for guiding the first and second optical signals in corresponding first and second waveguides, the first waveguide being piezo-optomechanically coupled to the piezoelectric material when the second contact layer and the third contact layer receive the actuation bias, the piezo-optomechanical coupling inducing a strain induced photoelastic refractive index change in the first waveguide and/or a movement of material boundaries that causes an optomechanical change to an effective refractive index of an optical mode within the first waveguide, and the ring modulator device is CMOS-compatible.

In various embodiments of the ring modulator device in accordance with the present invention, at least a portion of the first waveguide has been undercut due to removal of at least a portion of the dielectric layer; the piezoelectric material layer includes AlN and/or an alloy of AlN—ScN, and the first and second waveguides include $SiN_x$, $Al_2O_3$, AlN, and/or doped $SiO_2$, and the first and second cladding layers include $SiO_2$ or $Si_3N_4$.

In at least one embodiment of the present invention, a phase shifter device comprises a first contact layer (the first contact layer for routing an actuation bias), a dielectric layer formed on the first contact layer, a second contact layer formed on the dielectric layer (the second contact layer for receiving a first polarity of the actuation bias), a piezoelectric material layer formed on the second contact layer, a third contact layer formed on the piezoelectric material layer (the third contact layer for receiving a second polarity of the actuation bias), a first cladding layer formed on the third contact, a waveguide formed on the first cladding layer (the waveguide for transmitting an optical signal, the waveguide being a platform-actuated or a collinear-actuated phase shifting waveguide), and a second cladding layer formed on the waveguide (the first and second cladding layers for guiding the optical signal in the waveguide), the waveguide being piezo-optomechanically coupled to the piezoelectric material when the second contact layer and the third contact layer receive the actuation bias, the piezo-optomechanical coupling inducing a strain induced photoelastic refractive index change in the waveguide or a movement of material boundaries that causes an optomechanical change to an effective refractive index of an optical mode within the waveguide, and the phase shifter device is CMOS-compatible.

In various embodiments of the phase shifter device in accordance with the present invention, at least a portion of the waveguide has been undercut due to removal of at least a portion of the dielectric layer, the piezoelectric material layer includes AlN or an alloy of AlN—ScN; the waveguide includes $SiN_x$, $Al_2O_3$, AlN, or doped $SiO_2$, and the first and second cladding layers include $SiO_2$ or $Si_3N_4$; and further comprises a first coupler having an input and first and second outputs, a second waveguide formed on the first cladding layer (the second waveguide for transmitting a second optical signal, the second waveguide being a second platform-actuated or collinear-actuated phase shifting waveguide, the waveguide coupled to the first output of the first coupler and the second waveguide coupled to the second output of the first coupler), a second coupler having first and second inputs and an output (the first input of the second coupler coupled to the waveguide, and the second input of the second coupler coupled to the second waveguide), and the phase shifter forms a Mach-Zehnder interferometer device.

As used herein, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 1A illustrates a cross-sectional view of the device platform and architecture in accordance with one or more embodiments of the present invention. FIGS. 1B and 1C are scanning electron micrographs of a fabricated ring modulator device and ring cross-section, respectively.

FIGS. 2A and 2B are a scanning electron micrograph of a fabricated ring modulator device in accordance with one or more embodiments of the present invention and a cross-sectional drawing of the fabricated ring modulator device, respectively.

FIGS. 3A and 3B illustrate the cross-sectional deformation of actuated ring modulator devices in accordance with one or more embodiments of the present invention, while FIGS. 3C and 3D illustrate the Von Mises stress of the same actuated ring modulator devices.

FIG. 4A illustrates the radial and vertical displacement of a ring modulator device in accordance with one or more embodiments of the present invention as a function of undercut, while FIG. 4B illustrates the responsivity and first mechanical eigenfrequency as a function of undercut.

FIGS. 5A and 5B are scanning electron micrographs of a balanced Mach-Zehnder interferometer device in accordance with one or more embodiments of the present invention and a section of a single arm thereof, respectively, while FIG. 5C illustrates the piezoelectric deformation of a platform-actuated single period of a teardrop loop used to form each arm.

FIGS. 6A and 6B illustrate cross-sectional views of a gapless, differentially tuned directional coupler device and a gapped, differentially tuned directional coupler device in accordance with various embodiments of the present invention.

FIG. 10A illustrates the broad transmission spectrum of a working example non-undercut ring modulator device, while

FIG. 11A illustrates the broad transmission spectrum of a working example undercut ring modulator device, while

FIG. 12A illustrates the first mechanical eigenfrequency of a working example Mach-Zehnder interferometer device, while

DETAILED DESCRIPTION

Figure 7A:
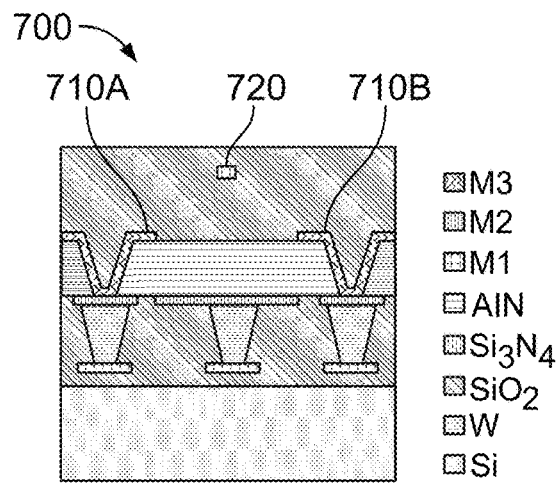
FIGS. 7A and 7B illustrate a cross-sectional view and a transparent plan view of an acousto-optic modulator device, respectively, in accordance with one or more embodiments of the present invention.

FIG. 1A illustrates a cross-sectional view of the device platform and architecture in accordance with at least one embodiment of the present invention. As shown in FIG. 1A, the device architecture uses silicon nitride ($Si_3N_4$) photonic elements clad in silicon dioxide ($SiO_2$), tightly mechanically coupled to an aluminum nitride (AlN) actuator with patterned metal electrodes above and below that allow for a vertical electric field to be applied to the piezoelectric AlN film. Employing a vertical electric field allows for the use of the piezoelectric coupling coefficients, $d_{33}$=5 pm/V and $d_{31}$=−2 pm/V, depending upon the thickness of the AlN layer and the material upon which it is grown. FIG. 1B is a scanning electron micrograph of a fabricated ring modulator device, while FIG. 1C is a cross-sectional scanning electron micrograph of a fabricated ring illustrating the $Si_3N_4$ ring encased in a $SiO_2$ cladding layer on an AlN actuator.

AlN has been utilized in many low-power piezoelectric MEMS. See P. Muralt, "AlN Thin Film Processing and Basic Properties," in *Piezoelectric MEMS Resonators*, H. Bhugra and G. Piazza, eds. (Springer International Publishing) pp. 3-37 (2017), the contents of which are incorporated herein by reference. AlN has an exceptionally low leakage current and can be deposited via CMOS-compatible, low temperature sputtering. The $SiO_2$ layer above the AlN's top electrode provides an optical buffer for the ultra-low-loss $Si_3N_4$ photonics layer, as illustrated in FIG. 1C. See E. A. Douglas, et al. "Effect of precursors on propagation loss for plasma-enhanced chemical vapor deposition of $SiN_x$:H waveguides," Optical Materials Express, vol. 6, no. 9, pp. 2892-2903 (2016), the contents of which are incorporated herein by reference, for a discussion of low-loss $Si_3N_4$. Note that while reference is made to $Si_3N_4$ throughout this patent, the silicon nitride is more accurately $SiN_x$, where x is approximately 1.33, but may be more or less than this depending upon the particular optical properties needed for a specific application.

As illustrated in FIG. 1A, an aluminum (Al) routing metal layer (M1) sits under the bottom electrode (M2) for the AlN actuator, separated by a thick $SiO_2$ spacer. Tungsten (W) vias connect all three metal layers (M1, M2, M3) and allow the fields to be applied via a low-loss electrical connection that can be made with surface electrodes at any location on the chip. This permits non-perturbative electrical connections to be made to arbitrarily small piezo-optomechanical photonic elements. The W electrical vias on the surface are protected by a $SiO_2$ cap, as illustrated in FIG. 1B in the center of the ring modulator device. Thus, the actuator platform is built on what is normally used as the top metal layer of a CMOS back-end-of-line process, allowing straight-forward post-CMOS integration for driver circuits, which could ultimately allow extremely dense electrical I/O to occur on-chip, with only modest electrical connections off-chip. A patterned amorphous silicon (Si) release layer is buried in $SiO_2$, underneath the AlN and its lower metal electrode M2, allowing a precise and terminal undercut during the fabrication process and enabling accurate targeting of specific mechanical resonance characteristics for the ring modulator.

Modulation is achieved via piezo-optomechanical coupling. This optomechanical and photoelastic coupling in the $Si_3N_4$ photonics is driven piezoelectrically by applying an electric field across the AlN via the top (M3) and bottom (M2) contacts. The piezoelectrically generated strain induces photoelastic refractive index changes in the $Si_3N_4$ waveguide and $SiO_2$ cladding, as well as movement of material boundaries that causes optomechanical changes to the effective refractive index of the optical mode. See S. G. Johnson, at al., "Perturbation theory for Maxwell's equations with shifting material boundaries," Physical Review E, vol. 65, art. no. 066611(2002), the contents of which are incorporated herein by reference. These two effects combine to form an effective voltage-induced refractive index shift of the $Si_3N_4$ waveguide. Both of these changes to the refractive index may be considered local changes due to the piezo-optomechanical coupling. In contrast, a global change also occurs from the piezo-optomechanical coupling due to a change in the optical length of the device, for example, a change in the radius of a ring modulator device. Which of these three effects dominates will depend upon the device type, its geometry, and the amount of mechanical compliance in the device, for example, if the device is undercut or not. In the case of a ring modulator, the effective responsivity of the device is characterized in terms of df/dV where f is the optical mode's resonant frequency. For the MZI modulators, responsivity is characterized by $d\psi/dV$ where $\Phi$ is the differential phase shift between the two arms of the modulator when opposite drive voltages are applied.

Both the bandwidth and the responsivity of a modulator are largely determined by the mechanical design of the AlN actuator, specifically its mechanical compliance. The mechanical response is quasi-static below the lowest mechanical eigenfrequency, placing an upper bound on the modulator bandwidth. There is an inverse relationship between the deformation, and thus the responsivity, of the modulator and its bandwidth. This leads to a design trade-off, with stiffer designs having higher mechanical eigenfrequencies but actuating a correspondingly smaller amount.

In the architecture of at least one embodiment of the present invention, the waveguide is tightly coupled to the actuator platform with the minimum possible $SiO_2$ thickness to sufficiently buffer the optical mode from the top actuator platform contact, formed of M3. As seen in FIG. 1C, excess oxide is etched away from the top of the AlN actuator platform to increase compliance and the ring is positioned close to the edge of the actuator platform to maximize waveguide strain.

Ring Modulator Devices

FIG. 2A is a scanning electron micrograph of a fabricated ring modulator device with the radius R indicated, while FIG. 2B is a cross-sectional drawing of the fabricated ring modulator device indicating the dimensions of various features in accordance with an embodiment of the present invention. The design of the ring modulator device illustrated in FIGS. 2A and 2B is based on the mechanical deformation of a $Si_3N_4$ ring with $SiO_2$ cladding that is evanescently coupled to a waveguide formed in the same waveguide layers, ideally with close to critical coupling for large modulation depths. The ring sits on an AlN disk actuator of approximately the same diameter, buffered from the metal electrodes of the disk actuator by a thick $SiO_2$ bottom cladding. The dimensions of the various features of the fabricated ring modulator device illustrated in FIGS. 2A and 2B are given in Table 1 below.

TABLE 1

| Nominal Ring Modulator Device Parameters | | | | | | | | | | |
| --- | --- | --- | --- | --- | --- | --- | --- | --- | --- | --- |
| Label | a | b | c | d | e | f | g | h | i | j | R |
| Material | SiO$_2$ | Si$_3$N$_4$ | SiO$_2$ | SiO$_2$ | SiO$_2$ | Al | AlN | Al | SiO$_2$ | Si | N/A |
| Length (μm) | 0.46 | 0.285 | 0.75 | 0.50 | 0.60 | 0.20 | 0.45 | 0.15 | 0.36 | 0.20 | 40.8 |

The resonant frequency of the mth optical mode of a ring modulator device is given by $f=mc/2\pi R_{eff}n_{eff}$, where m is the azimuthal eigenvalue of the mode, $R_{eff}$ is the effective radius of that mode, and $n_{eff}$ is the effective refractive index of the mode. FIGS. 3A and 3B illustrate the cross-sectional deformation in a finite element simulation of a ring modulator device when a voltage is applied across the AlN disk actuator.

FIG. 3A illustrates simulation results for the TE00 optical resonance being piezo-optomechanically actuated in a non-undercut ring modulator device at an actuation bias of −1 V across the AlN disk actuator. The optical power circulating in the ring resonator portion of the ring modulator device is shown in red. FIG. 3B illustrates simulation results for the TE00 optical resonance in a released AlN disk actuator with the same applied voltage and scaling. The deformation in FIGS. 3A and 3B are scaled by a factor of 10,000. FIGS. 3C and 3D illustrate the simulation results for the Von Mises stress from an applied voltage of −1V to a non-undercut ring modulator device and an undercut ring modulator device, respectively.

The performance of the ring modulator device is determined to a large extent by the thicknesses of the various layers in the device, as well as by the in-plane (lateral) dimensions of the features defined in these various layers. The layer thicknesses were determined by optimizing performance via finite element multi-physics modeling in combination with a multiplicity of fabrication constraints. While some of this performance modeling and optimization is discussed below, the majority of the following discussion will focus on variations around the baseline design specified in FIG. 2B and Table 1.

When the ring resonator portion of the ring modulator device is deformed by actuation of the underlying AlN actuator platform portion of the ring modulator device, both the radius, $R_{eff}$, and the effective index, $n_{eff}$, of the resonator mode change, shifting the resonant frequency. FIGS. 3A and 3B illustrate the scaled geometric deformation which modifies the path length of the ring resonator, while FIGS. 3C and 3D illustrate the stress from the actuation of the AlN actuator platform, which modifies the effective index. FIG. 4A illustrates the ring resonator deformation in both the radial and vertical directions as a function of the undercut width based upon simulation results. FIG. 4B, which illustrates both responsivity and the first mechanical eigenmode frequency as functions of the undercut width, indicates the optomechanical/geometric contribution to the responsivity depends, to first order, on only the radial component of the deformation. The ratio of radial to vertical deformation of the ring resonator differs depending on the exact details of the ring modulator device, including the size of the actuator platform and the ring resonator, the thicknesses of the SiO$_2$ cladding layers, the thicknesses of the remaining film layers, the compositions of the various film layers (which can vary the mechanical properties of the film layers), and fabrication details including residual stresses and etch angles.

A non-undercut ring modulator device remains relatively compliant in the radial direction while being securely anchored to the substrate, largely eliminating vertical deformation, as illustrated in FIGS. 3A and 4A. These mechanical properties give the non-undercut ring modulator device a relatively large responsivity for its stiffness compared to an undercut ring modulator device, as illustrated in FIG. 4B. When the same ring modulator device is undercut, the stiffness significantly decreases, improving the actuation, but a significant portion of the induced deformation is in the vertical direction, limiting the improvement in responsivity. Thus, the responsivity increase due to undercutting the ring modulator device does not necessarily make up for the dramatic decrease in actuation bandwidth, as illustrated in FIG. 4B. Eventually, increasing the undercut will cause the AlN actuation platform to become too long and thin to effectively actuate the Si$_3$N$_4$ ring resonator.

When the ring resonator is deformed, there is a corresponding stress generated in the ring resonator, as illustrated in FIGS. 3C and 3D, which modifies the refractive index through the photoelastic (or stress-optic) effect by an amount $\Delta n_{ij}=B_{ijkl}\sigma_{kl}$, where $B_{ijkl}$ and $\sigma_{kl}$ are the stress optic tensor and stress tensor coefficients, respectively. The stress-optic coefficient for Si$_3$N$_4$ is not described in the literature but has been estimated as being close to that of SiO$_2$. Using this estimate, the simulated stress-optic responsivity acts to reduce the total responsivity by approximately half compared to a model with just geometrically induced optomechanical coupling. This corresponds well with the measured responsivity discussed below and thus lends some credibility to the use of photoelastic constants similar to those of SiO$_2$.

By minimizing the diameter of the central pillar, the AlN actuator platform will have greater mechanical compliance and better performance. The central pillar diameter limits the minimum AlN actuator platform and ring resonator diameter, which constrains the platform's ability to achieve high-frequency operation. It also constrains the ability to have a larger undercut of the actuator platform to achieve higher responsivity. The central pillar size is set by the minimum size of vias necessary to make the electrical connections to the M2 and M3 layers illustrated in FIG. 1A. A large, 2 μm central via diameter, which can be seen in FIG. 2A, was used to ensure a reliable etch through the AlN actuator layer, and the central pillar was designed with an 8 μm diameter to achieve consistent yield of the electrical connectivity. Reducing the size of the central pillar will allow for a larger undercut or a smaller overall AlN actuator platform and ring resonator diameter, thereby providing additional flexibility.

While the embodiment of the present invention just described placed the Si$_3$N$_4$ waveguide on the AlN actuator platform, in other embodiments of the present invention, the Si$_3$N$_4$ waveguide is placed below the AlN actuator platform. The fabrication process for these "nitride-on-bottom" devices may use a Damascene process in which the Si$_3$N$_4$ waveguide is formed in a groove. The Si$_3$N$_4$ waveguide formed in this manner may be thicker, and in general, have a larger film stress than a film deposited without a Damascene process. In addition, this allows the use of films that must be deposited at temperatures higher than the melting temperature of aluminum.

Platform-Actuated Phase Shifters and Mach-Zehnder Interferometer Devices Formed Therefrom The following described Mach-Zehnder modulator (MZM) embodiment of the present invention is a balanced Mach-Zehnder interferometer (MZI) device with a piezo-optomechanically tunable path length in each arm. This approach allows for broad optical bandwidth operation, in contrast to the just described ring resonator devices, with the principal optical bandwidth constraint being set by the 1×2 (input) and 2×2 (output) multimode interference (MMI) couplers. FIG. 5A is a scanning electron micrograph of the two platform-actuated phase shifting arms of a balanced MZI device, along with a section of a single arm at higher magnification in FIG. 5B. Each of the platform-actuated phase shifting arms has a width of 42 µm, a length of 480 µm and includes 27 periods of a teardrop-shaped loop forming a meandering path waveguide. While the platform-actuated phase shifting arms of this embodiment of the present invention include 27 periods of the teardrop-shaped loop, other embodiments may include more or fewer periods or may be formed of periods having other than a teardrop-shaped loop. The simulation result of the piezoelectric deformation of a single period of the teardrop-shaped loop in a platform-actuated phase shifting arm is illustrated in FIG. 5C at an actuation bias of −20 V. The vertical deformation in FIG. 5C has been scaled by a factor of 1000. An optical signal at the input goes through a 50:50 MMI splitter, traverses the actuatable sections of the waveguides that comprise the two platform-actuated phase shifting arms, and exits after a 2×2 MMI combiner. The power ratio between the two outputs is determined by the phase difference of the two platform-actuated phase shifting arms.

The platform-actuated phase shifting arms are piezoelectrically actuated with opposing "push-pull" actuation biases, causing one arm to expand and the other arm to contract, effectively doubling the deformation for a given voltage. In this embodiment of the present invention this is achieved with differential actuation biases, but in other embodiments of the present invention it could be achieved with a single actuation bias using the vias to reverse the signal and ground electrodes for each platform-actuated phase shifting arm. Each platform-actuated phase shifting arm is tethered in the center along the length of the arm, thereby creating the "wings" of the "butterfly" in FIG. 5C. The waveguide on each platform-actuated phase shifting arm meanders in such a way as to maximize strain while minimizing optical loss. Note that, unlike the ring resonator, the MZI device waveguides run along the width of the actuator platform, with the waveguide being effectively strained and the optical path length changed even when the released actuator platform bends out of the plane and becomes curved. As will be appreciated by one of ordinary skill in the art, a variable phase shift is only required in one of the two arms, although this will typically require an actuation bias twice that of the described "push-pull" configuration.

The platform-actuated phase shifting arms of the balanced MZI device illustrated in FIGS. 5A-5C operate via two mechanisms. The first is through application of the actuation bias causing the optical path length of the meandering path waveguide to increase. This increase in optical path length may be envisioned as the "wingspan" of the "butterfly" in FIG. 5C increasing due to the expansion of the AlN actuator platform upon actuation. The second is that the strain induced by application of the actuation biases causes a change in the index of refraction within the meandering path waveguide. Which of these two mechanisms dominates in the platform-actuated phase shifting arms is a function of many design parameters, including both physical layout parameters and the materials selected (and their corresponding properties).

Gapless and Gapped Differentially Tuned Directional Coupler Devices

While a number of different directional coupler device designs exist, due to variations in the fabrication processes used to form these directional coupler devices, they rarely provide exactly the desired splitting ratio. For numerous applications, a coupler that provides, for example, anywhere between a 47:53 and a 53:47 splitting ratio may not suffice. The following embodiment of the present invention allows one to tune the splitting ratio such the desired splitting ratio is achieved.

As illustrated in FIG. 6A, a cross-section of the gapless, differentially tuned directional coupler device 600, the required constituent layers are the same as they are for both the ring modulator devices and the MZI devices previously described. As will be appreciated by one of ordinary skill in the art, the necessary lateral distance between the pair of adjacent $Si_3N_4$ waveguides 610A, 610B will depend upon the magnitude of the available actuation voltage, the wavelength of the optical signal, and the range of required tuning, e.g., ±2% versus ±10%. An exemplary spacing between the pair of adjacent $Si_3N_4$ waveguides 610A, 610B is one-third of the free-space wavelength of the optical signal.

While the illustrated gapless, differentially tuned directional coupler 600 employs differential actuation voltages applied to the metal 3 layer with ground applied to the metal 2 layer, other embodiments of the present invention may employ a single actuation voltage, but without the common metal 2 layer. In this case, each AlN actuation layer will have its own independent metal 2 layers (not shown). By applying the actuation voltage to metal 2 for one AlN actuation layer and to metal 3 of the other AlN actuation layer, one need generate only a single actuation voltage. The differentially tuned directional coupler 600 operates primarily through the stress-optic effect of the AlN actuation layers on the pair of adjacent $Si_3N_4$ waveguides 610A, 610B.

A gapped differentially tuned directional coupler device 650 is illustrated in FIG. 6B. This gapped differentially tuned directional coupler device 650 may provide a wider tuning range than the gapless differentially tuned directional coupler device 600 as the spacing between the pair of adjacent $Si_3N_4$ waveguides 660A, 660B can be varied over a wider range due to the increased mechanical compliance of this design.

Acousto-Optic Modulator and Frequency Shifter Devices

Figure 7B:
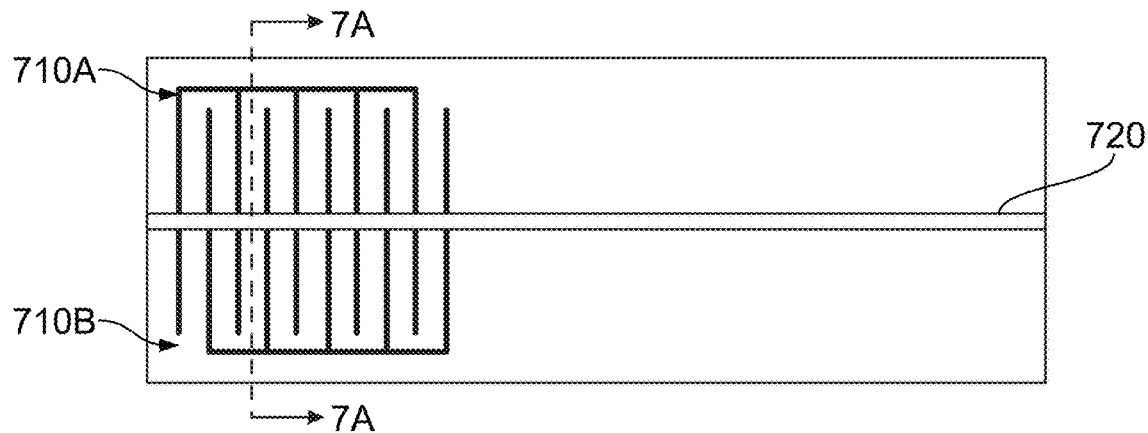

FIGS. 7A and 7B illustrate a cross-sectional view and a transparent plan view of an acousto-optic modulator (AOM) device 700, respectively, in accordance with an embodiment of the present invention. As illustrated in FIG. 7A, the required constituent layers for the AOM device 700 are the same as they are for the ring modulator devices, the MZI devices, and the differentially tuned directional coupler previously described. As will be appreciated by one of ordinary skill in the art, an AOM device, such as the AOM device 700 generally illustrated in FIG. 7A, may be designed for amplitude and frequency modulation or for frequency shifting.

As shown in the transparent plan view in FIG. 7B, the AOM device 700 includes first and second interdigital transducer (IDT) elements 710A, 710B and a $Si_3N_4$ waveguide 720. The first and second interdigital transducer (IDT)

elements 710A, 710B each include a plurality of parallel fingers. The remaining constituent layers of the AOM device 700 are not illustrated in FIG. 7B to better show the relative configurations of the first and second IDT elements 710A, 710B and the $Si_3N_4$ waveguide 720. As illustrated in FIG. 7B, the plurality of fingers of the first and second interdigital transducer (IDT) elements 710A, 710B are substantially perpendicular to the $Si_3N_4$ waveguide 720. While the AOM device 700 illustrated in FIG. 7A is formed directly on a substrate, it may be undercut, i.e., suspended over a cavity.

An actuation voltage signal in the RF spectrum is applied between the first and second IDT elements 710A, 710B, thereby setting the ridge of the device in mechanical motion. The ridge preferably flares at the end opposite of the first and second IDT elements 710A, 710B to reduce any reflections of the mechanical motion of the ridge. An optical signal propagating down the length of the ridge in the $Si_3N_4$ waveguide 720 undergoes at least a partial frequency shift, as the output optical signal likely contains power at both the incoming pump wavelength as well as at the frequency shifted wavelength. The power at the incoming pump wavelength may be blocked through the use of a downstream ring modulator device in accordance with the previously described embodiment of the present invention.

Figures 8A, 8B:
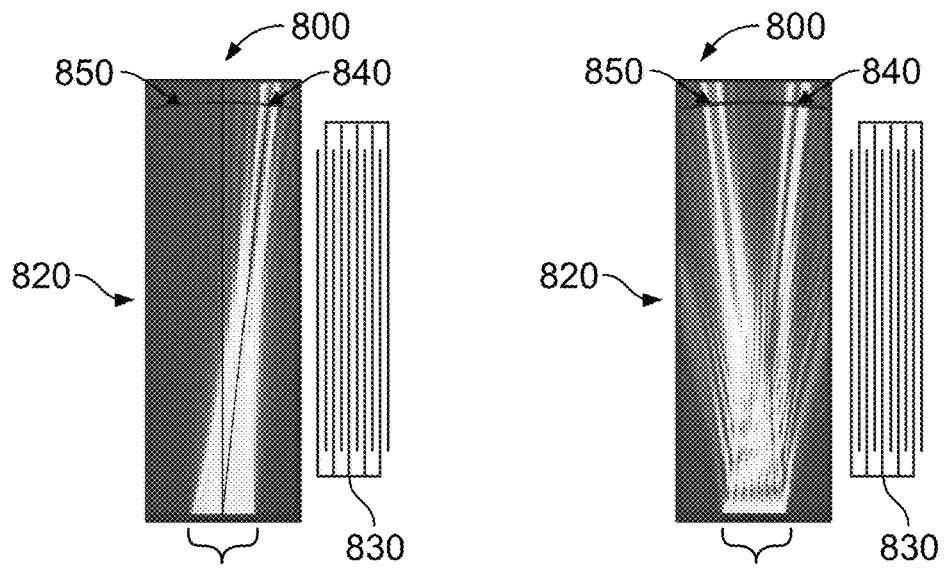
FIGS. 8A and 8B illustrate the simulation results of an un-actuated and actuated acousto-optic modulator device in accordance with one or more embodiments of the present invention, respectively.

In another embodiment of the present invention, an AOM device 800 may alter the phase, frequency, or amplitude of an incoming optical signal, or may be used as an optical isolator with an ultrawide frequency modulation bandwidth. The AOM device 800 in accordance with this embodiment of the present invention, simulation results of which are illustrated in FIGS. 8A and 8B, employs a different physical configuration than the previously described AOM device 700.

The incoming optical signal is split by a waveguide input port array 810, and it then freely diffracts into a planar region of AlN 820 and interacts with acoustic waves excited by one or more nearby IDTs 830. The plurality of fingers of the one or more nearby IDTs 830 are substantially parallel to the incoming optical signal, such that the launched acoustic waves are substantially perpendicular to the incoming optical signal, for example, ±15°, in contrast to the launched acoustic waves of the previously described AOM device 700, which are parallel/antiparallel to the incoming light. Similar to an arrayed waveguide grating, the lengths of the waveguides prior to the waveguide input port array 810 impart (or might not impart) the necessary phase profile at the waveguide input port array 810 to constructively interfere at the unmodulated output port 840, which is placed at a slight angle to the waveguide input port array 810, as illustrated in FIG. 8A. The acoustic waves, when present, deflect the beam in the opposite direction to the modulated output port 850, as illustrated in FIG. 8B. Guiding the optical and acoustic waves in the same layer lowers power consumption by reducing diffractive losses and increasing overlap with the optical field. The AOM Device 800 can utilize traditional surface acoustic waves (Rayleigh waves) or Lamb waves, which may offer higher modulation efficiency.

The placement of the unmodulated and modulated output ports 840, 850 is determined by a nominal modulation frequency for the acoustic waves. However, actively adjusting the phase of each waveguide prior to the waveguide input port array 810 either electro-optically (for zero static power dissipation), thermo-optically (for wider material compatibility), or other means creates an in-plane optical phased array that can be dynamically steered and focused to the desired location of the unmodulated output port 840 (or modulated output port 850) over a wide range of modulation frequencies. This same functionality enables compensation of environmental fluctuations and fabrication variations. Tapping a small fraction of the power in the output waveguide provides the feedback (detected by a single on-chip or off-chip photodetector) for simple, incoherent numerical methods to optimize the phase of each waveguide prior to the waveguide input port array 810. Closed-loop phase locking bandwidths may approach 1 MHz if rapid, drastic changes to the modulation frequency are desired and a fast phase tuning mechanism is used (e.g., electro-optic). The range of modulation frequencies can be increased by adding multiple IDTs 830 with varying center frequencies. The AOM device 800 is also a nonreciprocal isolator with low loss for light propagating from the waveguide input port array 810 to the modulated output port 850 as light propagating in the opposite direction experiences high extinction.

Ring Modulator Device Working Examples

Figure 9:
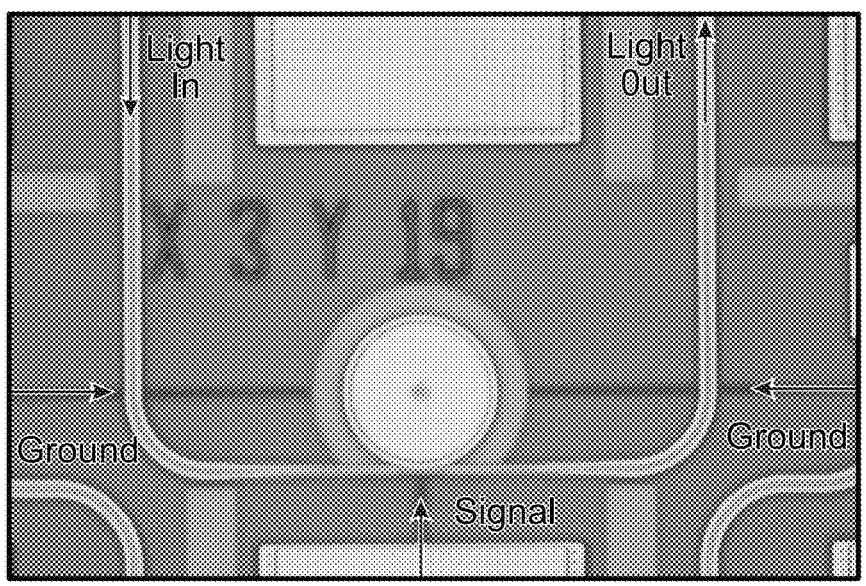
FIG. 9 is a scanning electron micrograph of a working example ring modulator device in accordance with one or more embodiments of the present invention.

FIG. 9 is a scanning electron micrograph of a ring modulator device having a 20.4 µm radius AlN actuator platform and a 19.8 µm outer radius $Si_3N_4$ ring resonator, coupled to an adjacent waveguide. Ground-signal-ground pads allow for electrical coupling to the AlN actuator platform. The $Si_3N_4$ ring resonator has a width of 800 nm and a height of 285 nm.

The specific ring modulator devices discussed here were selected because they exhibited the highest quality factor (lowest scattering losses), though other devices with slightly lower quality factors exhibited on-resonance extinction ratios in excess of 20 dB, due to better phase matching between the ring resonators and the corresponding coupled waveguides. To investigate differences in piezo-optomechanical actuation, ring modulator devices were characterized both before and after release; i.e., removal of the sacrificial amorphous silicon release layer, as shown in FIG. 1A. The ring modulator devices are released by exposing the buried amorphous silicon layer to a xenon difluoride ($XeF_2$) etchant after it is exposed by the plasma etch that defines the AlN actuator platform, as illustrated in FIG. 1A. Since the $XeF_2$ etch exhibits reasonable selectivity for a—Si relative to the $SiO_2$ cladding, the cladding was not substantially removed or roughened, and the ring resonators exhibited high optical quality factors even after release, with the ring modulator devices described here exhibiting no reduction in quality factor. Mechanically, and thus piezo-optomechanically, the ring modulator devices behave very differently before and after release.

Figure 10A:
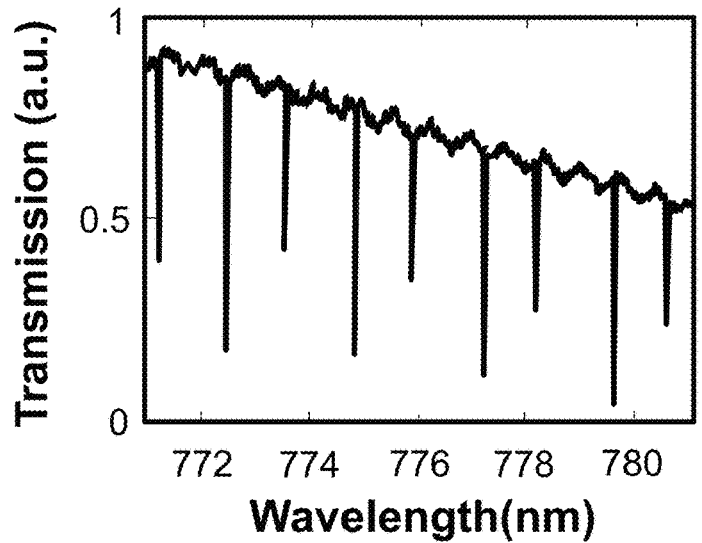
Figure 10B:
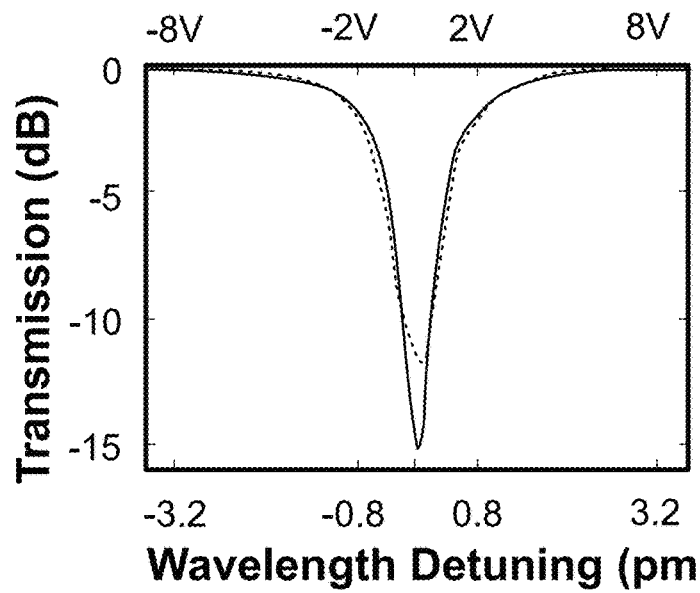
FIG. 10B illustrates the transmission spectrum of the same device.

FIG. 10A illustrates the broad transmission spectrum of a non-undercut ring modulator device measured through the adjacent coupled waveguide, as shown in FIG. 9. FIG. 10B illustrates the transmission spectrum of a single, deeply coupled (~13 dB) resonance with a loaded quality factor of 688,000, illustrated in blue. The resonance is overcoupled, with coupled mode theory yielding an intrinsic Q of ~1.5 million, illustrated in orange. The result is a loaded half-linewidth of 279 MHz. The lower x-axis of FIG. 10B is the wavelength detuning of the laser, while the upper x-axis is the corresponding calculated voltage required to change the transmission to the value associated with that detuning. With an initial insertion loss of −13 dB, the ring modulator device can be tuned to an extinction ratio of −3 dB with an actuation bias of 2 V.

Figure 10C:
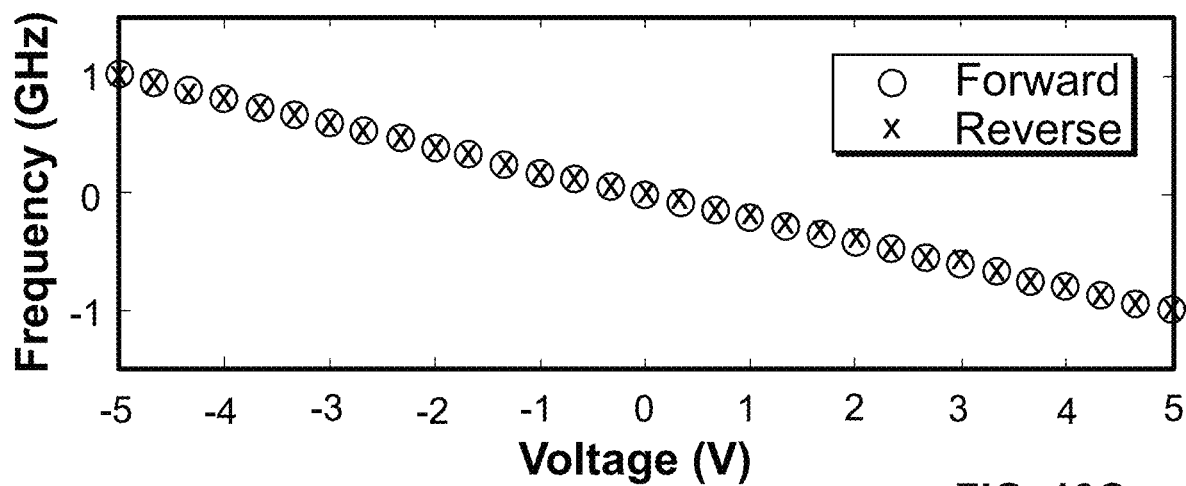
FIGS. 10C, 10D, and 10E illustrate the voltage-to-frequency responsivity, the first mechanical eigenfrequency, and the transmission result of actuating the same working example non-undercut ring modulator device, respectively.

The responsivity, df/dV, was determined by locking the tunable laser to the optical resonance while applying a sawtooth waveform with 100 ms period to the piezoelectric actuator; a wavemeter with 4 MHz resolution and 3 ms measurement time was used to measure the resulting laser frequency at many points throughout the period. The non-undercut ring modulator devices have a highly linear and hysteresis-free voltage-to-frequency responsivity of 200 MHz/V, as shown in FIG. 10C. This responsivity corresponds to a relative optical path length shift of $5.2 \times 10^{-7}$/V, which is larger than previously demonstrated in electro-optically tuned AlN ring resonator devices: $3.44 \times 10^{-7}$/V (C. Xiong) and $3.9 \times 10^{-7}$/V (S. Y. Zhu). When compared to electro-optic tuning of AlN, this ring modulator device's higher quality factors and larger relative optical path length shift per volt allows for significantly larger signal modulation per volt in the near-visible than has been previously demonstrated by related techniques.

Figure 10D:
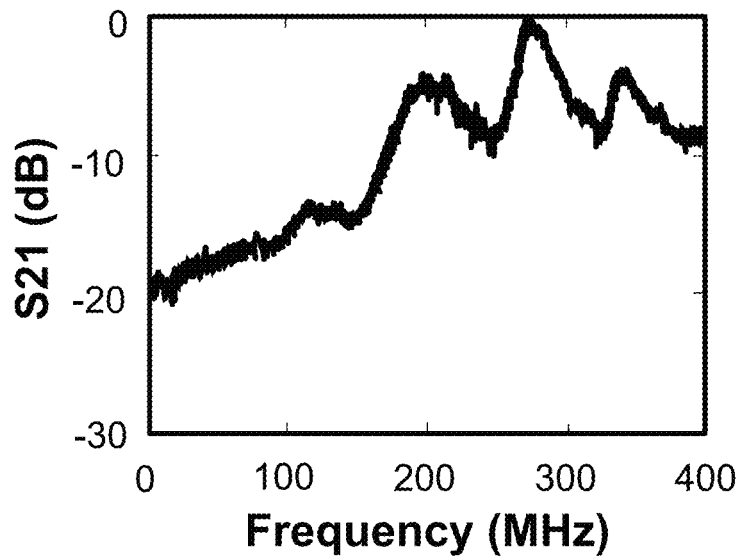
Figure 10E:
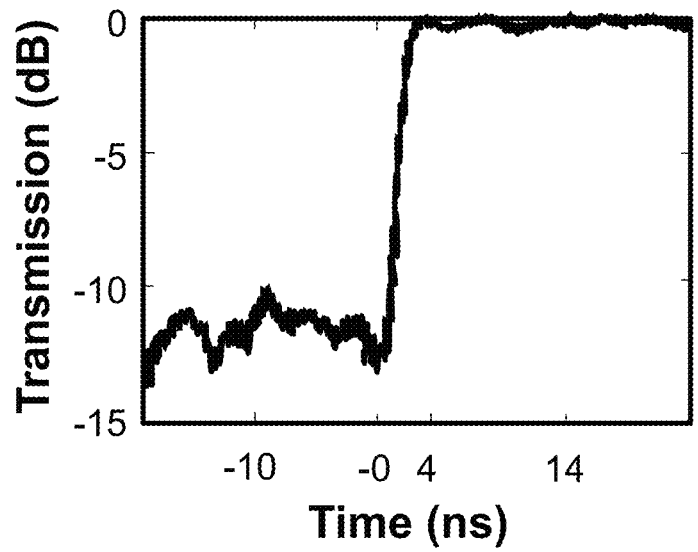

The non-undercut ring modulator devices have relatively large effective bandwidths. The small signal response was measured with a vector RF network analyzer, with one port applying an input RF electrical signal while the optical response was measured using a fast photodetector. As illustrated in FIG. 10D, the first mechanical eigenfrequency occurs at 204 MHz, which is expected to allow switching in a time of approximately 5 ns. FIG. 10E illustrates the result of applying a fast rising-edge actuation voltage waveform via an arbitrary waveform generator. As illustrated, the ring modulator device can be switched between two states with a contrast ratio of 13 dB in approximately 4 ns with an actuation voltage having an 8 V swing. This is presumably at or near the limit set by the resonant response from the first mechanical eigenmode, but it is also the lower limit of the arbitrary waveform generator and thus was not tested at faster switching times.

Figure 11A:
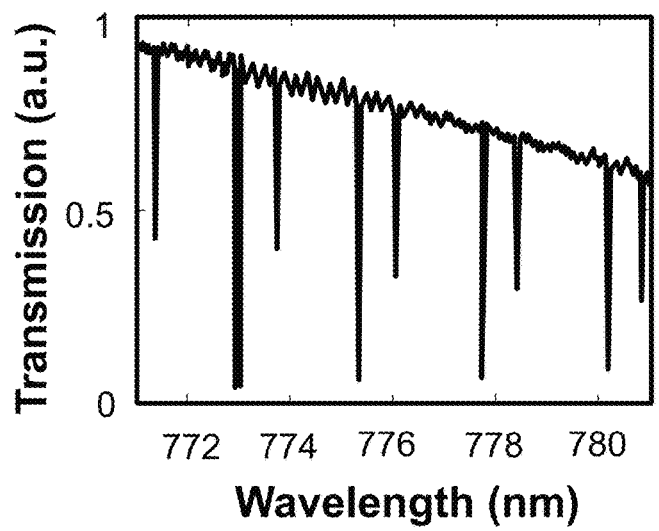
Figure 11B:
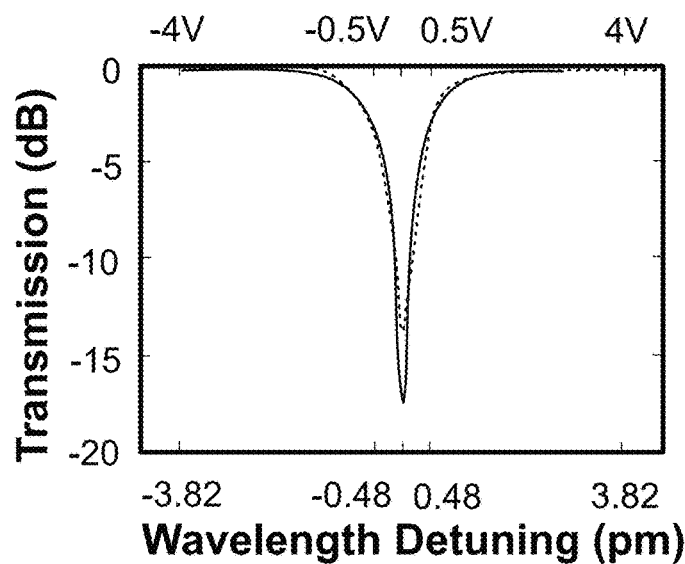
FIG. 11B illustrates the transmission spectrum of the same device.

FIG. 11A illustrates the transmission spectrum for a similar undercut ring modulator device after the device's sacrificial release layer has been etched away, resulting in a 12.4 µm undercut. Releasing the AlN actuator platform significantly improves responsivity while preserving the optical quality factor, despite a slight roughening of the $SiO_2$ cladding during the etch. This slight roughening of the $SiO_2$ cladding was observed with a scanning electron microscope. FIG. 11B illustrates the undercut ring modulator device has a loaded quality factor of 792,000, as measured illustrated in blue. Assuming the resonance is over-coupled to the waveguide yields an intrinsic quality factor $1.8 \times 10^6$, illustrated in orange. Note that there is some ambiguity as to the loading of this resonance, since it is nearly critically coupled. However, a less deeply loaded doublet, one azimuthal mode order higher, exhibits an intrinsic quality factor of $2.2 \times 10^6$ after fitting to the appropriate coupled-mode theory model and accounting for loading and coherent back-scattering. The lower x-axis of FIG. 11B is the wavelength detuning of the laser, while the upper x-axis is the corresponding calculated voltage required to change the transmission to the value associated with that detuning.

Figure 11C:
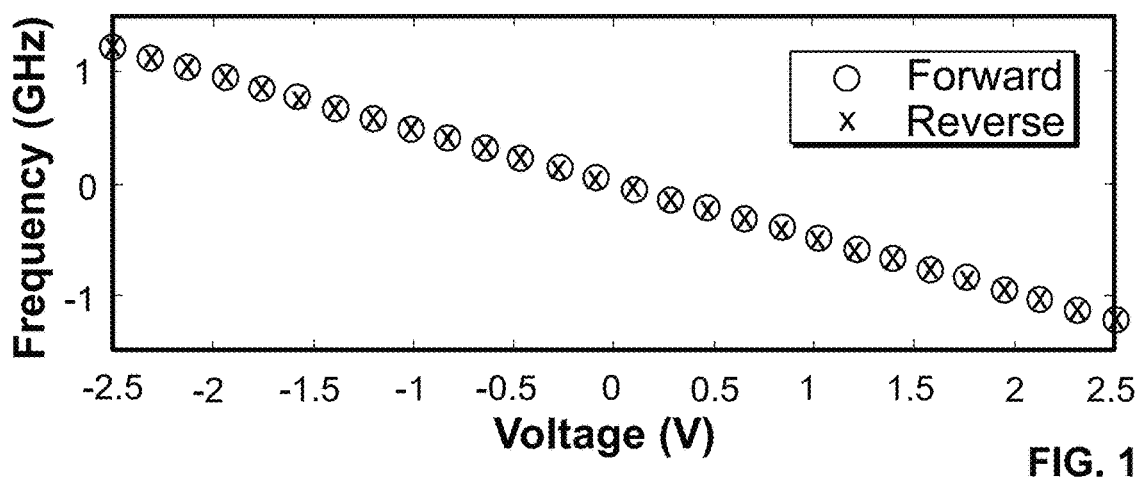
FIGS. 11C, 11D, and 11E illustrate the voltage-to-frequency responsivity, the first mechanical eigenfrequency, and the transmission result of actuating the same working example undercut ring modulator device, respectively.
Figure 11D:
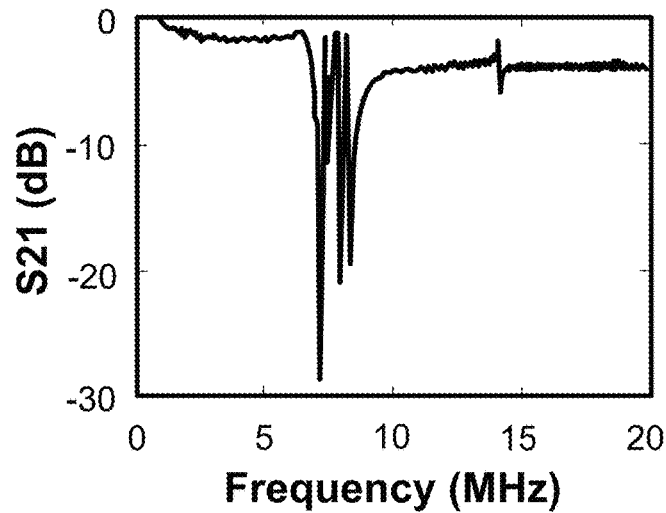
Figure 11E:
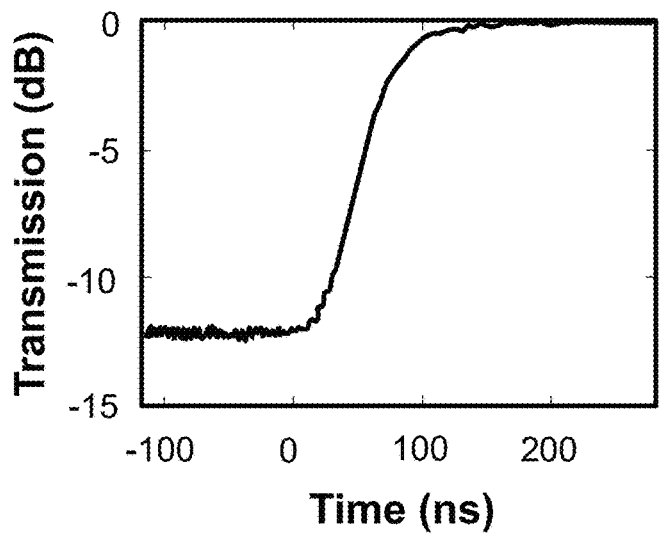

FIG. 11C illustrates the responsivity of the ring modulator device, 0.48 GHz/V, which is a factor of 2.4 increase relative to the non-undercut ring modulator device and corresponds to an optical path length shift of $1.25 \times 10^{-6}$/V. This increased responsivity comes at the cost of significantly reducing the frequency at which the first mechanical eigenfrequency occurs, 7.26 MHz as illustrated in FIG. 11D, compared to 204 MHz for the non-undercut ring resonator device as illustrated in FIG. 10D. FIG. 11E illustrates the undercut ring modulator device switching from maximum extinction to 90% of the device's maximum transmission in approximately 100 ns. The path length shifts of both undercut and non-undercut devices are significantly higher than previously demonstrated modulators using AlN piezoelectric tuning of $Si_3N_4$, which showed a relative shift of $2.15 \times 10^{-7}$/V (B. Dung), despite that structure having a lower mechanical eigenfrequency and thus a more mechanically compliant design.

Though near-visible electro-optic modulators using AlN as the waveguiding material have been demonstrated (C. Xiong) with higher bandwidths (approximately 10 GHz) than the piezoelectric modulation of this embodiment of the present invention, realistic constraints on voltage and modulation depth make it impossible to achieve those bandwidths at near-visible wavelengths and shorter. The bandwidth of a ring modulator device, $f_{3dB}$, is related to the photon lifetime as:

$$\tau_{ph} = \frac{\lambda Q}{2\pi c} \text{ and} \qquad \text{Eq. 1}$$

$$\frac{1}{f_{3dB}} = 2\pi \tau_{ph}. \qquad \text{Eq. 2}$$

Previous demonstrations of electro-optic modulators in AlN (C. Xiong) achieved very low quality factor resonators (~10,000) with an estimated responsivity of 0.28 GHz/V. While the low quality factors of these prior art electro-optic modulators did allow for fast modulation, the modulation depth demonstrated was not sufficient for many information processing applications and invoked significant transmitter power penalties in others. This is because, given the low Q and responsivity, the prior art electro-optic modulators would require approximately 400 V to achieve the same modulation depth demonstrated by this embodiment of the present invention. To achieve greater modulation depths with practical RF voltages, the quality factor for these prior art electro-optic modulators would have to be significantly increased, as the responsivity is mostly fixed by the AlN electro-optic coefficient and minimum necessary cladding thicknesses. This would, in turn, decrease the achievable bandwidth.

In contrast, the non-undercut ring modulator devices of this embodiment of the present invention have a bandwidth-limiting mechanical eigenfrequency of 204 MHz as currently constructed and illustrated in FIG. 10D. A ring resonator device with an intrinsic quality factor of $1.5 \times 10^6$ would have a photon lifetime limited 3 dB frequency cutoff of 0.5 GHz when critically coupled to an adjacent waveguide. Reducing the diameter of the non-undercut ring modulator devices of this embodiment of the present invention by a factor of two would raise the mechanical eigenfrequency to approximately this frequency. These ring modulator devices would then achieve a photon lifetime limited modulation bandwidth with a large modulation depth and low switching voltage at the same time. By further decreasing the ring modulator device diameter, which would continue raising the mechanical bandwidth limit while also raising the photon lifetime bandwidth limit, these devices would quickly reach the quality factor radiation limit at small diameters. It is anticipated that the non-undercut ring modulator devices of this embodiment of the present invention could achieve significantly larger bandwidths, while still maintaining practical switching voltages.

One of the advantages of using AlN for piezoelectric switching and modulation is its extremely high resistivity, which results in very low leakage currents and power dissipation. For the ring modulator devices of this embodiment of the present invention, a room temperature leakage current of 0.01 nA at 5 V was measured, which corresponds to a device resistance of 500 GΩ and a resistivity of $1.5 \times 10^{11}$ Ω·cm. To maintain a non-undercut ring modulator device in a state 10 dB from its maximum extinction requires a steady-state power dissipation of 8 pW at 2 V. For comparison, the non-undercut ring modulator device would require 0.62 mW to maintain the same switched state using thermo-optic tuning at typical pathlength tuning coefficient of $1.7 \times 10^{-6}$/mW for clad $Si_3N_4$ ring resonators using the results of (A. W. Elshaari).

The energy per bit required to change the state of a ring modulator device of this embodiment of the present invention is due to the work done by the power supply to charge the capacitance of the device. The capacitance of the device is $C=\varepsilon A/d$, where $\varepsilon$ is the permittivity of AlN (the dielectric constant of AlN is approximately 10), A is the area of the actuator, and d is the separation of the metal layers, which in this case is the thickness of the AlN layer, i.e., 450 nm. This yields a capacitance of 0.26 pF. The energy to charge this capacitance is given by $U=\frac{1}{2} *CV^2$, which for the demonstrated non-undercut ring modulator device switching between maximum extinction and 10 dB higher power with a 2 V actuation bias yields an energy of 520 fJ/bit.

Mach-Zehnder Interferometer Device Working Examples

Figure 12A:
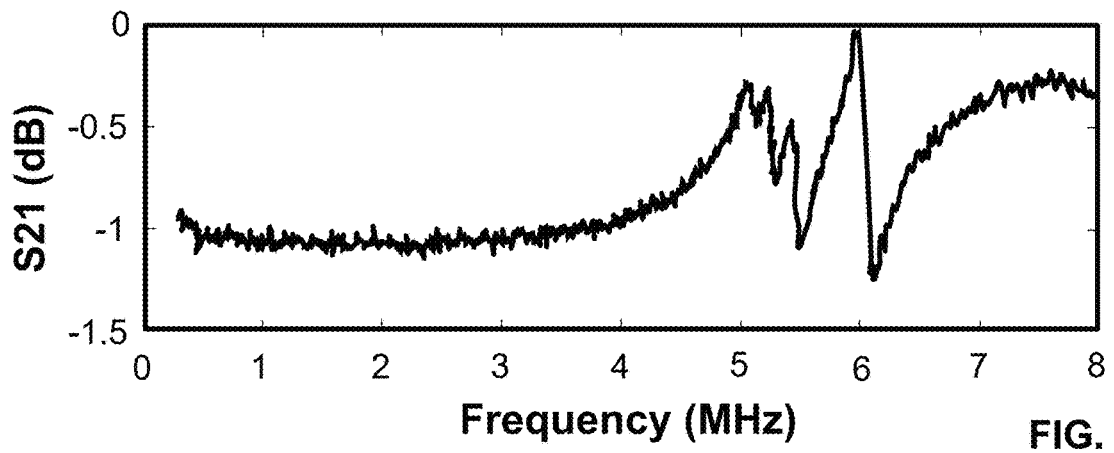
Figure 12B:
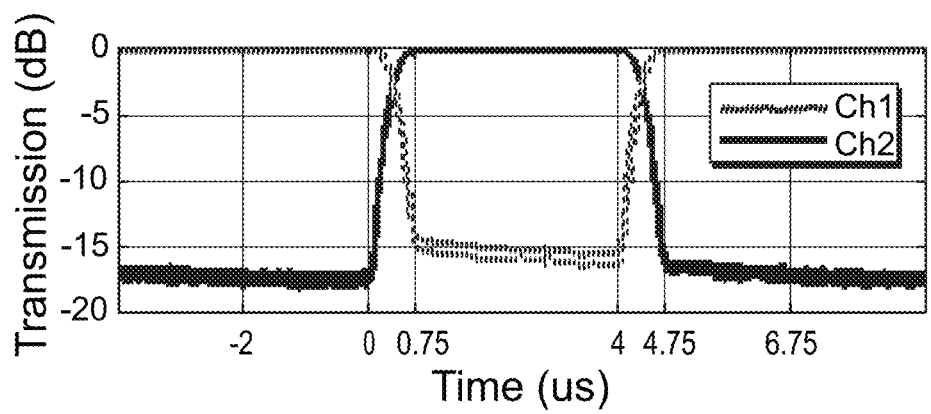
FIG. 12B illustrates the transmission result of actuating the same device.

An exemplary MZI device in accordance with at least one embodiment of the present invention consists of 27 periodically repeated bends across the 42 μm width and 480 μm length of each phase shifting arm with a 18.5 μm undercut, as illustrated in FIGS. 5A and 5B. Measurements with an RF network analyzer, the results of which are found in FIG. 12A, show that the MZI device could potentially be operated with a rise time near 250 ns, but testing was limited to demonstrating switching with a 750 ns rise time, illustrated in FIG. 12B, due to the bandwidth limitations of the high-voltage amplifier used to boost the voltage from an arbitrary waveform generator. The MZI device had a first mechanical eigenfrequency of 5.05 MHz. With an actuation bias amplitude of 20 V and a total waveguide length of 3 mm per arm, the tested device achieved a differential π phase shift between the two arms. This corresponds to an $LV_\pi$ of 24 V·cm. This result is substantially better than that demonstrated by prior art CMOS-compatible, AlN-based electro-optic phase shifters (S. Y. Zhu), which demonstrated an $LV_\pi$ of 240 V·cm. In terms of relative optical path length shift, the MZI device demonstrated a relative shift of $1.62 \times 10^{-6}$/V compared to $3.2 \times 10^{-7}$/V for electro-optic tuning (S. Y. Zhu). The loss per waveguide wrapping period was found to be 0.07 dB via measurement of devices of varied numbers of periods, which corresponds to approximately 1.89 dB loss in each arm of the measured MZI device. While this is not a particularly low loss per period, limited optimization was conducted to minimize the insertion loss, as the main focus was to assess the achievable phase shift per volt. With further optimization, it should be possible to approach the propagation loss demonstrated in the ring resonators, around 0.4 dB/cm, which would reduce the loss to approximately 0.12 dB over the length of the MZI device arm.

The switching results of the MZI devices are comparable to electrostatically actuated optical switching circuits when evaluating switching speed and voltages. See E. Bulgan, et al., "Submicron silicon waveguide optical switch driven by microelectromechanical actuator," Applied Physics Letters, vol. 92, art. no. 101110 (2008); H. Du, et al., "Mechanically-Tunable Photonic Devices with On-Chip Integrated MEMS/NEMS Actuators," Micromachines, vol. 7, art. no. 69 (2016); S. Han, et al., "Large-scale silicon photonic switches with movable directional couplers," Optica, vol. 2, pp. 370-375 (2015); and T. J. Seok, et al., "Large-scale broadband digital silicon photonic switches with vertical adiabatic couplers," Optica, vol. 3, pp. 64-70 (2016), the contents of each of which are incorporated herein by reference.

The energy and power necessary to operate the MZI device are the same as those discussed for the ring modulator device. Average leakage current from a fabricated MZI device arm at 20 V was 0.5 nA at room temperature, which corresponds to a device resistance of 40 GΩ and a sheet resistance of 190 GΩ·cm. A π phase shift for quasi-DC operation of these piezo-optomechanical MZI devices requires only 20 nW to maintain at room temperature, which is a factor of 10 lower than prior art PZT strain-based phase modulators (J. P. Epping; N. Hosseini) at room temperature while achieving similar bandwidth and responsivity. Using the previous relative shift per power for thermo-optic tuning, $1.7 \times 10^{-6}$/mW (A. W. Elshaari), the switched state for this thermos-optically tuned MZI device would require 38 mW to maintain. The capacitance of each MZI device arm is 4.1 pF. The energy to charge this capacitance with a 40 V actuation bias switching signal yields an energy of 6.6 nJ/bit.

The piezo-optomechanical phase shifters and associated MZI devices of this embodiment of the present invention were designed as the non-resonant analogues of the ring modulator devices, having large piezoelectric actuator platforms and thus large responsivity that allows for low-voltage operation in a compact space. An alternative approach is to use a straight waveguide (no bends) that is strained and has its cross-sectional dimensions modified by the piezoelectric modulation, for example, a linear MZI device 1300 as illustrated in FIG. 13A.

The linear MZI device 1300 includes an input directional coupler 1310, which may be tunable, two straight, i.e., linear, waveguide arms 1320A, 1320B, and an output directional coupler 1330, which may again be tunable. As illustrated in FIG. 13A, one waveguide arm 1320A has first actuation biases applied to it to implement the phase shift function. In other embodiments of the present invention, second actuation biases may optionally be applied to the other waveguide arm 1320B. Preferably the second actuation biases are differentially polarized, i.e., have the opposite voltages, relative to the first actuation biases to improve the tuning range without requiring a greater voltage. As compared to the platform-actuated phase shifting arms of the MZI device illustrated in FIGS. 5A-5C, in which the waveguides meander back and forth across the actuators, the actuators in the linear MZI device 1300 illustrated in FIG. 13A run directly below the waveguide arms 1320A, 1320B, i.e., the actuators and the waveguide arms 1320A, 1320B are collinear. This configuration, in which an actuator and a waveguide arm 1320A are collinear, will be termed a "collinear-actuated" phase shifting arm. FIGS. 13B and 13C illustrate an example of, and modeling results for, this type of collinear-actuated phase shifter device, for example, one waveguide arm 1320A, 1320B, in accordance with an embodiment of the present invention, where the stress-optic tensor coefficients of $SiO_2$ have again been used for those of $Si_3N_4$. FIG. 13B illustrates not only the physical configuration of a collinear-actuated phase shifter device having a 5 μm wide waveguide on a 10 μm wide AlN actuator platform, but also the optical power, shown in red, for the TE00 optical mode. FIG. 13C illustrates the Von Mises stress in the collinear-actuated phase shifter device at an actuation bias of 1V.

Figure 13A:
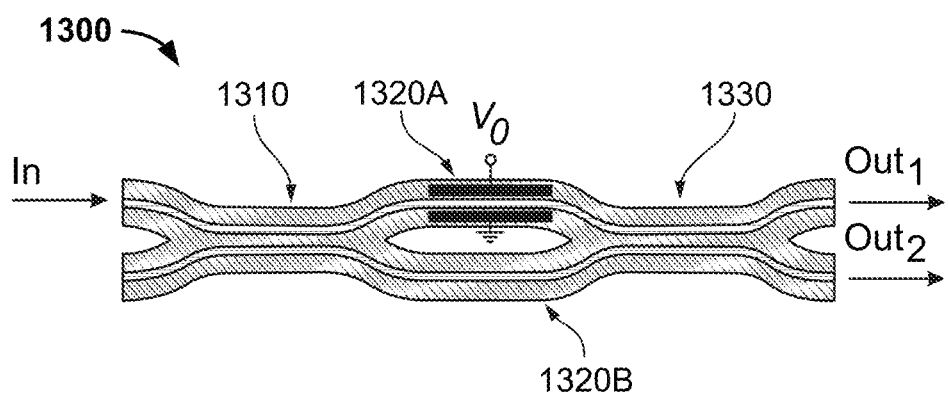
FIG. 13A illustrates a linear Mach-Zehnder interferometer device in accordance with one or more embodiments of the present invention.
Figure 13B:
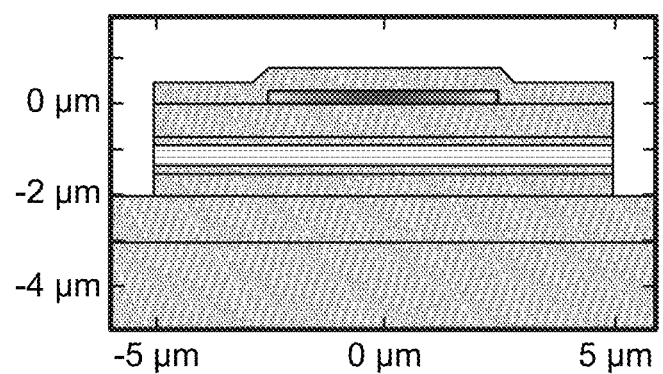
FIGS. 13B and 13C illustrate an example of, and the modeling results for, a collinear-actuated waveguide phase shifter, such as that found in the linear Mach-Zehnder interferometer device illustrated in FIG. 13A.
Figure 13C:
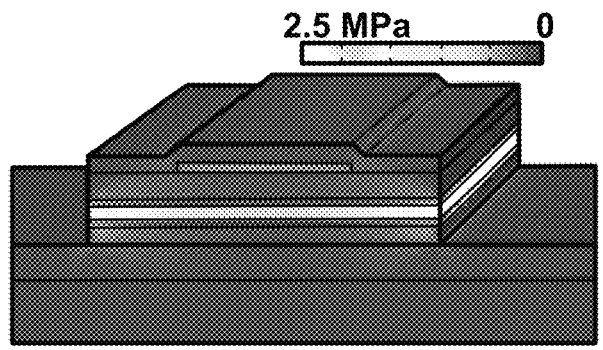

The collinear-actuated phase shifting arms of the linear MZI device 1300 illustrated in FIG. 13A operate via two mechanisms. The first is through application of the actuation bias causing the dimensions of the waveguide to increase, due, for example, to stresses that are partially illustrated by the Von Mises stresses in FIG. 13C. The second is that the strain induced by application of the actuation biases causes a change in the index of refraction within the waveguide. Which of these two mechanisms dominates in the collinear-actuated phase shifting arms is a function of many design parameters, including both physical layout parameters and the materials selected (and their corresponding properties).

Figure 13D:
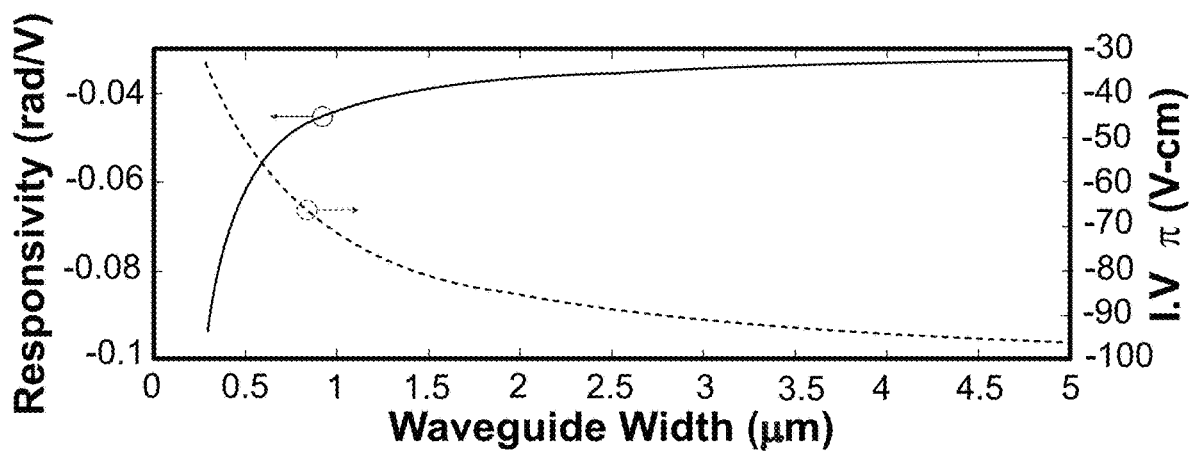
FIG. 13D illustrates the responsivity and the $LV_\pi$ of the same collinear-actuated waveguide phase shifter.

As illustrated in FIG. 13D, both the responsivity and $LV_\pi$ are strong functions of the width of the waveguide arm 1320A, 1320B, favoring waveguides wider than the single-mode cut-off This is somewhat advantageous, since the use of a waveguide much wider than the single-mode cutoff allows for reduced scattering losses from sidewalls, which in turn allows for centimeter-scale propagation lengths that lead to low values of $V_\pi$. The responsivity is significantly smaller than the platform-actuated MZI device illustrated in FIGS. 5A-5C, requiring longer lengths for practical voltage limits. However, in the regime where the responsivity is largest (widest waveguides), the stress-optic effect is dominant, which leaves open the possibility that $Si_3N_4$ could actually have a significantly larger responsivity.

The straight waveguide device design, such as that found in the collinear-actuated waveguide arms 1320A, 1320B of the linear MZI device 1300 illustrated in FIG. 13A, does not suffer from the bending losses found in the platform-actuated MZI device illustrated in FIGS. 5A-5C, and has a comparatively high mechanical eigenfrequency, leading to a large bandwidth. For example, the first mechanical eigenfrequency appears at 233 MHz for a 5 µm wide waveguide actuated by a 10 µm wide actuator platform. While there is some variation in the eigenfrequency as a function of width, these straight waveguide devices maintain high fundamental eigenfrequencies across the range illustrated in FIG. 13D. Straight waveguide devices of this design, such as those found in the collinear-actuated waveguide arms 1320A, 1320B of the linear MZI device 1300 illustrated in FIG. 13A, offer the benefits of the demonstrated ring modulator devices, such as low actuation bias operation and high bandwidth, but can be done with broadband optical operation, albeit at the expense of relative compactness.

Ring Modulator Device Working Examples Operating at Cryogenic Temperatures

Figure 14:
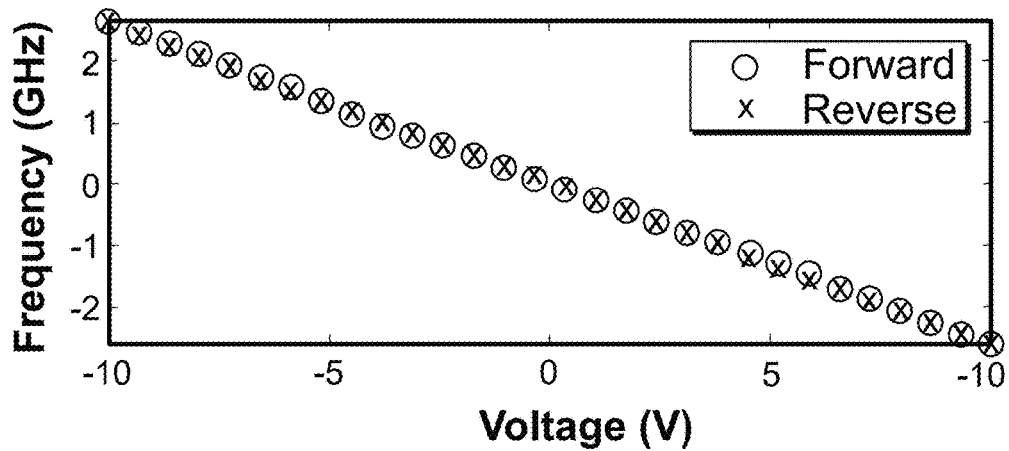
FIG. 14 illustrates the voltage-to-frequency responsivity characteristics of a working example ring resonator device tested at 7 K.

While all embodiments of the present invention readily operate at room temperature, to test the AlN actuator platform's compatibility with cryogenic environments, the ring modulator devices were tested optically and electrically in a closed loop cryostat. FIG. 14 illustrates the responsivity characteristics of a ring resonator device tested at 7 K with a 20 $V_{pp}$ slow saw-wave. The piezoelectric responsivity of 0.26 GHz/V did not significantly deviate from room temperature and is free of hysteresis. This is quite unlike semiconductor-based modulators based on carrier dispersion that require significant device modification to operate at cryogenic temperatures due to large variations in carrier concentration. See M. Gehl, et al., "Operation of high-speed silicon photonic micro-disk modulators at cryogenic temperatures," Optica, vol. 4, pp. 374-382 (2017), the contents of which are incorporated herein by reference.

A large advantage of the AlN actuator platform is that it is extremely stable with respect to temperature fluctuations at cryogenic temperatures, due to the dramatic decreases in thermal expansion and thermo-optic coefficients at these temperatures. Previous work (A. W. Elshaari) has demonstrated the decreasing thermo-optic coefficient of PECVD silicon nitride resonators at temperatures approaching absolute zero. At 18 K, the change in refractive index with temperature is below 300 ppb/K for both $SiO_2$ and $Si_3N_4$. In addition, resistance measurements taken at cryogenic temperatures of a ring modulator device showed a resistance greater than 20 TΩ(6.1 TΩ-cm), decreasing the power dissipation required to operate the device by a factor of 40 compared to room temperature. This is a significant advantage in a cryogenic environment where the cooling system must remove all dissipated heat to maintain the operating temperature. In particular, this would result in dissipating only 200 fW to hold the non-undercut ring modulator device at 10 dB contrast from its maximum insertion loss state (2 V actuation bias applied).

The fact that the piezoelectrically actuated devices exhibit high performance at cryogenic temperatures makes them suitable candidates for cryogenic photonic integrated circuit components, especially in the near-visible and visible spectrum. This is in contrast to conventional thermo-optic tuning at these temperatures. Though the specific heat of $Si_3N_4$ decreases with temperature, the prior art (A. W. Elshaari) shows it does not fully compensate for the greatly reduced thermo-optic coefficient in regard to the necessary on-chip power dissipation to achieve a given phase shift. These temperature-dependent material parameters decrease the efficacy of thermo-optic tuning, greatly increasing the heat generated during tuning and thus the cooling power required of the cryostat. For example, a thermo-optic phase modulator made from a 1 cm long $Si_3N_4$ waveguide starting at 7 K would need to increase in temperature to approximately 41 K to create a π phase shift. Using the approximate relative path length shift of $1.14 \times 10^{-6}$/mW for thermo-optic tuning at 18 K (A. W. Elshaari), then a π phase shift in a 10 cm length would require 19.7 mW. In addition, a thermally tuned cryogenic photonic integrated circuit would need to accommodate significant local temperature variations, making a high channel density in these prior art photonic integrated circuits extremely impractical.

Additional Embodiments

While the various described embodiments of the present invention employed $Si_3N_4$ as the waveguide material, in other embodiments of the present invention, $Al_2O_3$ may be used as the waveguide material. The use of $Al_2O_3$ as the waveguide material extends performance of these embodiments into the blue and ultraviolet wavelength range. In yet other embodiments of the present invention, the waveguide material may be AlN or doped $SiO_2$. Which material is used as the waveguide will depend upon the operating wavelength(s) of the device.

While the various described embodiments of the present invention employed $SiO_2$ as the cladding material for the $Si_3N_4$ waveguide material, in other embodiments of the present invention, other dielectric materials may be employed for the cladding material. For example, $Si_3N_4$ may be used as the cladding material as long as the refractive index of the waveguide material is greater than that of the $Si_3N_4$ cladding at the desired operating wavelength.

As the various embodiments of the present invention may need to operate at specific wavelength(s), the various devices, for example, the ring modulator devices, may need to be trimmed, i.e., tuned, for operation at the specific wavelength(s). This trimming may be done at the wafer-level, in which all devices on the wafer are subjected to the same trimming treatment. Alternatively, this trimming may be done at the individual device-level, in which the devices are trimmed individually. The wafer-level trimming process may include, for example, heating of the entire wafer. The individual device-level tuning may include, for example, the use of a laser to heat individual devices.

One advantage of the present invention compared to prior art devices is the decoupled nature of the piezoelectric actuation and optical properties of the devices, allowing independent optimization of each. For example, the piezoelectric tuning of the devices can be improved by alloying AlN with scandium nitride (ScN). AlN—ScN alloy thin films have demonstrated up to a factor of 5 improvement of the piezoelectric coefficients. See M. Akiyama, et al., "Influence of growth temperature and scandium concentration on piezoelectric response of scandium aluminum nitride alloy thin films," Applied Physics Letters, vol. 95, art. no. 162107 (2009), the contents of which are incorporated herein by reference. These AlN—ScN alloy thin films would allow for lower actuation voltages or the actuation of stiffer designs for faster modulation speeds. Also, further reduction in the optical losses should be possible with continued fabrication optimization. Even without further optimization, the exceptionally low on-chip power dissipation, cryogenic compatibility, stable operation, and large optical transparency window will be transformative for many integrated photonic circuit applications.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A CMOS-compatible piezoelectric deformable photonic device platform comprising:
    a first contact layer adapted to route an actuation bias;
    a dielectric layer formed on the first contact layer;
    a second contact layer formed on the dielectric layer, the second contact layer adapted to receive a first polarity of the actuation bias;
    a piezoelectric material layer formed on the second contact layer;
    a third contact layer formed on the piezoelectric material layer, the third contact layer adapted to receive a second polarity of the actuation bias;
    a first cladding layer formed on the third contact;
    a waveguide formed on the first cladding layer, the waveguide adapted to transmit an optical signal; and
    a second cladding layer formed on the waveguide;
    wherein the first cladding layer and the second cladding layer are adapted to guide the optical signal in the waveguide; and
    wherein the waveguide is adapted to be piezo-optomechanically coupled to the piezoelectric material when the second contact layer and the third contact layer receive the actuation bias, the piezo-optomechanical coupling inducing at least one of a strain induced photoelastic refractive index change in the waveguide and a movement of material boundaries that causes an optomechanical change to an effective refractive index of an optical mode within the waveguide.

2. The CMOS-compatible piezoelectric deformable photonic device platform of claim 1, wherein at least a portion of the waveguide has been undercut due to removal of at least a portion of the dielectric layer.

3. The CMOS-compatible piezoelectric deformable photonic device platform of claim 1, wherein the piezoelectric material layer includes at least one of AlN and an alloy of AlN—ScN.

4. The CMOS-compatible piezoelectric deformable photonic device platform of claim 1, wherein the waveguide includes at least one of $SiN_x$, $Al_2O_3$, AlN, and doped $SiO_2$.

5. The CMOS-compatible piezoelectric deformable photonic device platform of claim 1, wherein each of the first and second cladding layers includes at least one of $SiO_2$ and $Si_3N_4$.

6. The CMOS-compatible piezoelectric deformable photonic device platform of claim 1,
    wherein the CMOS-compatible piezoelectric deformable photonic device platform forms a ring modulator device; and
    the CMOS-compatible piezoelectric deformable photonic device platform further comprising a second waveguide, the second waveguide formed on the first cladding layer, the second cladding layer formed on the second waveguide, the second waveguide adapted to transmit a second optical signal, the second waveguide adapted to evanescently couple to the waveguide.

7. The CMOS-compatible piezoelectric deformable photonic device platform of claim 1,
    wherein the CMOS-compatible piezoelectric deformable photonic device platform forms a phase shifter device; and
    wherein the waveguide is a platform-actuated or a collinear-actuated phase shifting waveguide.

8. The CMOS-compatible piezoelectric deformable photonic device platform of claim 1,
    wherein the CMOS-compatible piezoelectric deformable photonic device platform forms a Mach-Zehnder interferometer device;
    wherein the waveguide includes:
        a first coupler having an input and first and second outputs;
        first and second platform-actuated or collinear-actuated phase shifting arms coupled to corresponding ones of the first and second outputs of the first coupler; and
        a second coupler having first and second inputs and first and second outputs, the first and second inputs of the second coupler coupled to corresponding ones of the first and second platform-actuated or collinear-actuated phase shifting arms.

9. The CMOS-compatible piezoelectric deformable photonic device platform of claim 1,
    wherein the CMOS-compatible piezoelectric deformable photonic device platform forms a directional coupler device;
    the CMOS-compatible piezoelectric deformable photonic device platform further comprising a second waveguide, the second waveguide formed on the first cladding layer, the second cladding layer formed on the second waveguide, the second waveguide adapted to transmit a second optical signal, the second waveguide adjacent the waveguide; and
    wherein the first and second cladding layers are continuous between the waveguide and the second waveguide or include a gap between the waveguide and the second waveguide.

10. The CMOS-compatible piezoelectric deformable photonic device platform of claim 1,
    wherein the compatible piezoelectric deformable photonic device platform forms an acousto-optic modulator device;

the CMOS-compatible piezoelectric deformable photonic device platform further comprising first and second interdigital transducers (IDTs), each of the first and second IDTs including a corresponding plurality of parallel fingers; and wherein the plurality of fingers of the first and second IDTs are adapted to be substantially parallel or substantially perpendicular to the optical signal.

11. The CMOS-compatible piezoelectric deformable photonic device platform of claim 1, wherein the CMOS-compatible piezoelectric deformable photonic device platform forms at least two devices, each of the at least two devices including at least one of a ring modulator device, a phase shifter device, a Mach-Zehnder interferometer device, a directional coupler device, a tunable directional coupler device, an acousto-optic modulator device, and a frequency shifter device.

12. A ring modulator device comprising:
a first contact layer adapted to route an actuation bias;
a dielectric layer formed on the first contact layer;
a second contact layer formed on the dielectric layer, the second contact layer adapted to receive a first polarity of the actuation bias;
a piezoelectric material layer formed on the second contact layer;
a third contact layer formed on the piezoelectric material layer, the third contact layer adapted to receive a second polarity of the actuation bias;
a first cladding layer formed on the third contact;
first and second waveguides, each of the first and second waveguides formed on the first cladding layer, the first and second waveguides adapted to transmit corresponding first and second optical signals, the second waveguide adapted to evanescently couple to the first waveguide; and
a second cladding layer formed on the first and second waveguides;
wherein the first and second cladding layers are adapted to guide the first and second optical signals in corresponding first and second waveguides;
wherein the first waveguide is adapted to be piezo-optomechanically coupled to the piezoelectric material when the second contact layer and the third contact layer receive the actuation bias, the piezo-optomechanical coupling inducing at least one of a strain induced photoelastic refractive index change in the first waveguide and a movement of material boundaries that causes an optomechanical change to an effective refractive index of an optical mode within the first waveguide; and
wherein the ring modulator device is CMOS-compatible.

13. The ring modulator device of claim 12, wherein at least a portion of the first waveguide has been undercut due to removal of at least a portion of the dielectric layer.

14. The ring modulator device of claim 12, wherein the piezoelectric material layer includes at least one of AlN and an alloy of AlN—ScN.

15. The ring modulator device of claim 12,
wherein the first and second waveguides each includes at least one of $SiN_x$, $Al_2O_3$, AlN, and doped $SiO_2$; and
wherein each of the first and second cladding layers includes at least one of $SiO_2$ and $Si_3N_4$.

16. A phase shifter device comprising:
a first contact layer adapted to route an actuation bias;
a dielectric layer formed on the first contact layer;
a second contact layer formed on the dielectric layer, the second contact layer adapted to receive a first polarity of the actuation bias;
a piezoelectric material layer formed on the second contact layer;
a third contact layer formed on the piezoelectric material layer, the third contact layer adapted to receive a second polarity of the actuation bias;
a first cladding layer formed on the third contact;
a waveguide formed on the first cladding layer, the waveguide adapted to transmit an optical signal, the waveguide being a platform-actuated or a collinear-actuated phase shifting waveguide; and
a second cladding layer formed on the waveguide;
wherein the first and second cladding layers are adapted to guide the optical signal in the waveguide;
wherein the waveguide is adapted to be piezo-optomechanically coupled to the piezoelectric material when the second contact layer and the third contact layer receive the actuation bias, the piezo-optomechanical coupling inducing at least one of a strain induced photoelastic refractive index change in the waveguide and a movement of material boundaries that causes an optomechanical change to an effective refractive index of an optical mode within the waveguide; and
wherein the phase shifter device is CMOS-compatible.

17. The phase shifter device of claim 16, wherein at least a portion of the waveguide has been undercut due to removal of at least a portion of the dielectric layer.

18. The phase shifter device of claim 16, wherein the piezoelectric material layer includes at least one of AlN and an alloy of AlN—ScN.

19. The phase shifter device of claim 16,
wherein the waveguide includes at least one of $SiN_x$, $Al_2O_3$, AlN, and doped $SiO_2$; and
wherein each of the first and second cladding layers includes at least one of $SiO_2$ and $Si_3N_4$.

20. The phase shifter device of claim 16 further comprising:
a first coupler having an input and first and second outputs;
a second waveguide formed on the first cladding layer, the second waveguide adapted to transmit a second optical signal, the second waveguide being a second platform-actuated or collinear-actuated phase shifting waveguide, the waveguide coupled to the first output of the first coupler and the second waveguide coupled to the second output of the first coupler;
a second coupler having first and second inputs and an output, the first input of the second coupler coupled to the waveguide, and the second input of the second coupler coupled to the second waveguide; and
wherein the phase shifter forms a Mach-Zehnder interferometer device.

* * * * *